(12) United States Patent
Wang

(10) Patent No.: US 10,250,262 B2
(45) Date of Patent: Apr. 2, 2019

(54) INTEGRATED CIRCUIT INCLUDING AN ARRAY OF LOGIC TILES, EACH LOGIC TILE INCLUDING A CONFIGURABLE SWITCH INTERCONNECT NETWORK

(71) Applicant: Flex Logix Technologies, Inc., Mountain View, CA (US)

(72) Inventor: Cheng C. Wang, San Jose, CA (US)

(73) Assignee: Flex Logix Technologies, Inc., Mountain View, CA (US)

( * ) Notice: Subject to any disclaimer, the term of this patent is extended or adjusted under 35 U.S.C. 154(b) by 0 days.

(21) Appl. No.: 15/898,796

(22) Filed: Feb. 19, 2018

(65) Prior Publication Data

US 2018/0198450 A1 Jul. 12, 2018

Related U.S. Application Data

(62) Division of application No. 15/375,309, filed on Dec. 12, 2016, now Pat. No. 9,906,225, which is a division
(Continued)

(51) Int. Cl.
*H03K 19/177* (2006.01)
*H01L 25/00* (2006.01)
*H03K 19/173* (2006.01)

(52) U.S. Cl.
CPC ... *H03K 19/17724* (2013.01); *H03K 19/1735* (2013.01); *H03K 19/1776* (2013.01); *H03K 19/17744* (2013.01); *H03K 19/17748* (2013.01)

(58) Field of Classification Search
USPC .............................................. 326/37–41, 47
See application file for complete search history.

(56) References Cited

U.S. PATENT DOCUMENTS

| 4,661,947 A | 4/1987 | Lea et al. |
| 5,175,539 A | 12/1992 | Richter |

(Continued)

FOREIGN PATENT DOCUMENTS

WO WO 2014/144832 9/2014

OTHER PUBLICATIONS

Ma et al., "Switch Box and Connection-Box for Segmented Interconnection in Hierarchical FPGA", Intl. Wkshp Logic, pdfs.semanticscholar.org, 2004, 8 pages.
(Continued)

*Primary Examiner* — Anh Tran
(74) *Attorney, Agent, or Firm* — Neil A. Steinberg

(57) ABSTRACT

An integrated circuit comprising a plurality of logic tiles, wherein each logic tile (i) is physically adjacent to at least one other logic tile of the plurality and (ii) includes a configurable switch interconnect network including a plurality of switches electrically interconnected and arranged into a plurality of switch matrices, wherein the plurality of switch matrices are arranged into a plurality of stages including: (a) at least two of the stages which is configured in a hierarchical network, and (b) a mesh stage, wherein each switch matrix of the mesh stage includes an output that is directly connected to an input of a plurality of different switch matrices of the mesh stage and wherein the mesh stage of switch matrices of each logic tile is directly connected to the mesh stage of switch matrices of at least one other logic tile of the plurality of the logic tiles.

20 Claims, 19 Drawing Sheets

Related U.S. Application Data of application No. 15/347,071, filed on Nov. 9, 2016, now Pat. No. 9,793,898, which is a division of application No. 15/041,085, filed on Feb. 11, 2016, now Pat. No. 9,503,092.

(60) Provisional application No. 62/119,215, filed on Feb. 22, 2015.

(56) References Cited

U.S. PATENT DOCUMENTS

| | | | |
|---|---|---|---|
| 5,299,317 A | 3/1994 | Chen et al. | |
| 5,349,248 A | 9/1994 | Parlour et al. | |
| 5,519,629 A | 5/1996 | Snider | |
| 5,530,813 A | 6/1996 | Paulsen et al. | |
| 5,987,028 A | 11/1999 | Yang et al. | |
| 6,055,233 A | 4/2000 | Park | |
| 6,185,220 B1 | 2/2001 | Muthukrishnan et al. | |
| 6,230,252 B1 | 5/2001 | Passint et al. | |
| 6,307,852 B1 | 10/2001 | Fisher et al. | |
| 6,335,930 B1 | 1/2002 | Lee | |
| 6,671,865 B1 | 12/2003 | Ali et al. | |
| 6,693,456 B2 | 2/2004 | Wong | |
| 6,868,084 B2 | 3/2005 | Konda | |
| 6,885,669 B2 | 4/2005 | Konda | |
| 7,378,938 B2 | 5/2008 | Konda | |
| 7,424,010 B2 | 9/2008 | Konda | |
| 7,424,011 B2 | 9/2008 | Konda | |
| 7,786,757 B2 | 8/2010 | Mayer et al. | |
| 7,924,052 B1 | 4/2011 | Feng et al. | |
| 7,970,979 B1 | 6/2011 | Verma et al. | |
| 7,982,497 B1 | 7/2011 | Trimberger | |
| 8,098,081 B1 | 1/2012 | Trimberger | |
| 8,170,040 B2 | 5/2012 | Konda | |
| 8,269,523 B2 | 9/2012 | Konda | |
| 8,270,400 B2 | 9/2012 | Konda | |
| 8,363,649 B2 | 1/2013 | Konda | |
| 8,378,712 B2 | 2/2013 | Lee et al. | |
| 8,436,454 B2 | 5/2013 | Norman | |
| 8,493,090 B1 * | 7/2013 | Trimberger | H03K 19/177 326/101 |
| 8,531,943 B2 | 9/2013 | Olofsson | |
| 8,626,815 B1 | 1/2014 | Langhammer | |
| 8,805,914 B2 | 8/2014 | Pell et al. | |
| 8,898,611 B2 | 11/2014 | Konda | |
| 9,374,322 B2 | 6/2016 | Konda | |
| 9,503,092 B2 | 11/2016 | Wang | |
| 9,509,634 B2 | 11/2016 | Konda | |
| 9,529,958 B2 | 12/2016 | Konda | |
| 9,793,898 B2 | 10/2017 | Wang | |
| 9,906,225 B2 | 2/2018 | Wang | |
| 10,003,553 B2 | 6/2018 | Konda | |
| 2002/0113619 A1 | 8/2002 | Wong | |
| 2004/0010767 A1 | 1/2004 | Agrawal et al. | |
| 2004/0032866 A1 | 2/2004 | Konda | |
| 2004/0056757 A1 | 3/2004 | Konda | |
| 2004/0150422 A1 | 8/2004 | Wong | |
| 2005/0053061 A1 | 3/2005 | Konda | |
| 2005/0063410 A1 | 3/2005 | Konda | |
| 2005/0117573 A1 | 6/2005 | Konda | |
| 2006/0114023 A1 | 6/2006 | Ting et al. | |
| 2006/0159078 A1 | 7/2006 | Konda | |
| 2006/0164120 A1 | 7/2006 | Verma et al. | |
| 2006/0165085 A1 | 7/2006 | Konda | |
| 2006/0268691 A1 | 11/2006 | Ramanan | |
| 2007/0124565 A1 | 5/2007 | Jones et al. | |
| 2009/0009216 A1 | 1/2009 | Lepape | |
| 2009/0289661 A1 | 11/2009 | Lee et al. | |
| 2011/0121366 A1 | 5/2011 | Or-Bach et al. | |
| 2012/0012895 A1 | 1/2012 | Or-Bach et al. | |
| 2012/0284379 A1 | 10/2012 | Zievers | |
| 2012/0286822 A1 | 11/2012 | Madurawe | |
| 2013/0083701 A1 | 4/2013 | Tomic et al. | |
| 2014/0313930 A1 | 10/2014 | Konda | |
| 2015/0046895 A1 | 2/2015 | Konda | |
| 2015/0049768 A1 * | 2/2015 | Konda | H04L 49/102 370/411 |
| 2016/0034625 A1 | 2/2016 | Wang et al. | |
| 2017/0070449 A1 | 3/2017 | Konda | |
| 2018/0131636 A1 | 5/2018 | Konda | |

OTHER PUBLICATIONS

Aggarwal et al., "Routing Architectures for Hierarchical Field Programmable Gate Arrays", Proceedings 1994 IEEE International Conference Computer Design, 1994, pp. 475-478.

Maggs, "The multi-Benes and multibutterfly networks", Jul. 1996, 5 pages.

Li, "Routability Prediction for Field Programmable Gate Arrays With Hierarchical Interconnection Structures" Thesis, Masters of Science, The University of Guelph, 1998, 79 pages.

"Permutation routing in hypercubic networks", Topics in parallel computing, CS1221, 1999, 14 pages.

DeHon, "Unifying Mesh- and Tree-Based Programmable Interconnect", IEEE Transactions on VLSI Systems, 2004, vol. 12 No. 10, 15 pages.

Mrabet et al., "Performances improvement of FPGA using novel multilevel hierarchical interconnection structure", ICCAD, San Jose, 2006, 5 pages.

Marrakchi et al., "Efficient Mesh of Tree Interconnect for FPGA Architecture", IEEE, 2007, 4 pages.

Khaddour et al., "Prototyping Mesh-of-Tree NOC Based MPSOC on Mesh-of-Tree FPGA Devices", Design and Reuse, https://www.design-reuse.com/articles/27859/prototyping-mesh-of-tree-noc-based-mpsoc-on-mesh-of-tree-fpga-devices.html, 2011, 6 pages.

Marrakchi et al., "FPGA Interconnect Topologies Exploration", International Journal of Reconfigurable Computing, vol. 2009, Article ID 259837, 2009, 13 pages.

Marrakchi et al., "Performances comparison between Multilevel hierarchical and Mesh FPGA interconnects", International Conference on Design and Test of Integrated Systems in Nanoscale Technology, 2006. DTIS 2006, 6 pages.

Cheng C. Wang et al., "A 1.1 GPOS/mW FPGA Chip with Hierarchical Interconnect Fabric", IEEE Symp. VLSI Circuits, pp. 136-137, 2011.

Cheng C. Wang et al., "A Multi-Granularity FPGA with Hierarchical Interconnects for Efficient and Flexible Mobile Computing", pp. 15-17, ISSCC, 2014.

Andre' DeHon, "Unifying Mesh- and Tre-Based Programmable Interconnect", IEEE Transactions on VLSI Systems, vol. 12, No. 10, pp. 1051-1065, Oct. 2004.

John Kim et al., "Adaptive Routing in High-Radix Clos Network", IEEE, SC2006, Nov. 2006.

Hayder Mrabet et al., "Performance Improvement of FPGA using novel multilevel hierarchical interconnection structure", ICCAD 06, Nov. 5-9, 2006, San Jose, CA.

International Search Report and Written Opinion of International Searching Authority re: PCT/US2016/017431, dated Apr. 22, 2016, 9 pages.

"Building Efficient, Reconfigurable Hardware using Hierarchical Interconnects", Thesis, Doctor of Philosophy in Electrical Engineering, Ph.D. Thesis, UCLA, Jun. 2013, UCLA, by Cheng C. Wang, http://escholarship.org/uc/item/2vt0b5cb.

Jan M. Rabaey et al., "Digital Integrated Circuits: A Design Perspective", 2nd Edition, Prentice Hall, 2003, Title pages and pp. 413-417.

Quinn, Michael J, "Parallel Computing: Theory and Practice", 2nd. ed., 1994, McGraw Hill Series in Computer Science, Networks, and Parallel Computing, ISBN 0-07-051294-9, pp. 52-61.

Guy Lemieux et al., "Using Sparse Crossbars within LUT Clusters", Proceedings of the ACM/SIGDA International Symposium on Field Programmable Gate Arrays 2001, Feb. 11-13, 2001, Monterey, CA.

Chihming Chang, et al., Arbitrary Size Benes Networks, Journal Parallel Processing Letters, PPL, vol. 7, No. 3, pp. 279 to 284, 1997.

Hoda El-Sayed et al.; "The r-truncated Benes Networks and their Randomized Routing Algorithms"1997 International Conference on Parallel and Distributed Systems, Seoul, Korea, Dec. 1997.

(56) References Cited

OTHER PUBLICATIONS

James R. Goodman et al., Hypertree: A Multiprocessor Interconnection Topology, by Computer Science Technical Report #427, Dept. of EECS, University of California, Berkeley, Apr. 1981.
Russ Miller and Quentin F. Stout, "Data Movement Techniques for the pyramid computer", SIAM Journal on Computing, vol. 16, No. 1, pp. 38-60, Feb. 1987.
Ronald I. Greenberg, "The Fat-Pyramid: A Robust Network for Parallel Computation", in W. J. Daily, Editor, Advanced Research in VLSI: Proceedings of the Sixth MIT Conference, pp. 195-213, MIT Press, 1990.
Virtex-4 Family Review, DS-112; v1.5, Preliminary Product Spec., Feb. 10, 2006.
Rose et al., "Flexibility of Interconnection Structures for Field Programmable Gate Arrays", IEEE Journal on Solid-State Circuits, vol. 26, No. 3, Mar. 1991, 6 pages.
Yuan et al., "A Multi-Granularity FPGA With Hierarchical, Interconnects for Efficient and Flexible Mobile Computing", IEEE Journal of Solid-State Circuits, vol. 50, No. 1, Jan. 2015, pp. 1-15.
EPO Supplementary Search Report, dated Sep. 21, 2018, 12 pages.

\* cited by examiner ively, "SM") stages. (See, for example, FIG. 1C). As
INTEGRATED CIRCUIT INCLUDING AN ARRAY OF LOGIC TILES, EACH LOGIC TILE INCLUDING A CONFIGURABLE SWITCH INTERCONNECT NETWORK

RELATED APPLICATION

This application is a divisional of U.S. Non-Provisional application Ser. No. 15/375,309, filed Dec. 12, 2016 (still pending), which is a divisional of U.S. Non-Provisional application Ser. No. 15/347,071, filed Nov. 9, 2016 (now U.S. Pat. No. 9,793,898), which is a divisional of U.S. Non-Provisional application Ser. No. 15/041,085, filed Feb. 11, 2016 (now U.S. Pat. No. 9,503,092). This application, the '309 application, the '071 application and the '085 application claim priority to and the benefit of U.S. Provisional App. No. 62/119,215, filed Feb. 22, 2015, which is incorporated herein by reference in its entirety.

INTRODUCTION

The present inventions are directed to an integrated circuit having a mixed-radix and/or mixed-mode switch matrix interconnect architectures. For example, in one aspect, the present inventions are directed to an integrated circuit having a plurality of computing elements (for example, a look-up-table, processor circuit, controller circuit and/or combinational logic circuit) wherein each computing element is associated with a plurality of switch matrices which are configured in at least two different radices in relation to an interconnect network of the switch matrices associated with other computing elements of the integrated circuit. For example, in one embodiment where the integrated circuit is a field programmable gate array (FPGA) having at least one logic tile, the switch matrices of a first stage (which are directly connected to one or more associated computing elements, for example, via hierarchy conductors) are configured in a boundary-less radix-3 interconnect and the switch matrices of a second stage are configured as a radix-2 interconnect. In another embodiment, the switch matrices of a first stage are configured in a radix-4 interconnect and the switch matrices of a second stage are configured as a radix-2.

In another aspect, the present inventions are directed to an integrated circuit having mixed-mode interconnect architectures. For example, in one embodiment, the integrated circuit includes a plurality of computing elements, each computing element is associated with a plurality of switch matrices that are organized in stages wherein (i) the switch matrices of at least one switch stage are configured in a hierarchical network (in relation to the switch stages of the other switch matrices and/or computing elements) and (ii) the switch matrices of at least one stage are configured in a mesh, torus or the like network (hereinafter "mesh network"). In one exemplary embodiment, the integrated circuit includes three stages of switch matrices including a first stage of switch matrices (which are directly connected to one or more associated computing elements) and a second stage (which are connected to switch matrices of the first stage and a third stage) that are configured in hierarchical interconnects/networks (for example, radix-4 and radix-3, respectively) and switch matrices of the third stage that are configured in a mesh interconnect or mesh network, wherein, in a mesh-type interconnect, each switch matrix of the third stage is connected to at least one other switch matrix of that third stage via mesh interconnects/conductors. In this mixed-mode switch matrix architecture, the third stage mesh network connects to switch matrices in the second stage, and can optionally connect (via hierarchy conductors) to a fourth stage of hierarchical or mesh networks.

Notably, the integrated circuit may be, for example, a processor, controller, state machine, gate array, system-on-chip (SOC), programmable gate array (PGA) and/or FPGA.

Briefly, an FPGA is an integrated circuit which may be configured and/or reconfigured (hereinafter, unless stated otherwise, collectively "configured" or the like (e.g., "configure", "configuring" and "configurable")) by a user, customer and/or a designer before and/or after manufacture. The FPGA includes, among other things, a plurality of tiles having programmable logic components (often called "configurable logic blocks" (CLB), "logic array blocks" (LAB), or "logic tiles"—herein collectively "logic tiles") and a network of configurable interconnects that facilitate communication between the logic tiles. (See, for example, FIGS. 1A and 1B). The logic tiles include a plurality of switch matrices (for example, an M×N switch matrix) arranged in a plurality of switch matrix or switch matrices (hereinafter collectively "SM") stages. (See, for example, FIG. 1C). As such, the logic tiles are configurable to communicate, during operation of the integrated circuit, with at least one other logic tile.

Each logic tile typically includes thousands of transistors which may be configured to perform combinational and/or sequential functions (simple and/or complex). Such transistors are often interconnected to form a plurality of switches or multiplexers having two or more inputs. The selection inputs of the switches or multiplexers may be electrically connected to memory cells which, when programmed, determine which input of the multiplexer or switch is connected to the associated output. The memory cells may be static or dynamic. For example, in the context of static memory cells, the selection inputs may be electrically coupled to one or more flip-flops, latches and/or more complete blocks/arrays of memory (for example, an SRAM array) that may be programmed after IC manufacture.

The present inventions may be implemented in one or more (or all) of the logic tiles of an FPGA. For example, in one embodiment, a logic tile of an FPGA may include a plurality of computing elements (for example, a look-up-table, processor circuit, controller circuit and/or combinational logic circuit) wherein each computing element is associated with a plurality of SM stages that are configured in at least two different radices to interconnect with SM stages associated with other computing elements of the integrated circuit. In another embodiment, the logic tile may include a plurality of switch matrices organized as a plurality of SM stages wherein (i) at least one SM stage is configured in a hierarchical interconnect/network (in relation to the SM stages of the other switch matrix macros) and (ii) at least one SM stage configured in a mesh interconnect or network. For example, in one embodiment, the logic tile may include a plurality of switch matrices of a hierarchical network consisting of a plurality of SM stages which are configured in at least two different radices (for example, a first SM stage configured as a radix-4 interconnect, a second SM stage configured as a boundary-less radix-3 interconnect, and a third SM stage configured as a radix-2 interconnect) and one or more SM stages configured in mesh network/interconnects (for example, a fourth SM stage which is directly connected to the aforementioned third SM stage via hierarchy conductors).

Notably, there are many inventions described and illustrated herein. The present inventions are neither limited to any single aspect nor embodiment thereof, nor to any combinations and/or permutations of such aspects and/or embodiments. The aspects of the present inventions, and/or embodiments thereof, may be employed alone or in combination with one or more of the other aspects of the present inventions and/or embodiments thereof.

BRIEF DESCRIPTION OF THE DRAWINGS

The present inventions may be implemented in connection with embodiments illustrated in the attached drawings. These drawings show different aspects of the present inventions and, where appropriate, reference numerals illustrating like structures, components, materials and/or elements in different figures are labeled similarly. It is understood that various combinations of the structures, components, materials and/or elements, other than those specifically shown, are contemplated and are within the scope of the present inventions.

Moreover, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein. Notably, an embodiment or implementation described herein as "exemplary" is not to be construed as preferred or advantageous, for example, over other embodiments or implementations; rather, it is intended reflect or indicate the embodiment(s) is/are "example" embodiment(s).

Figure 4A:
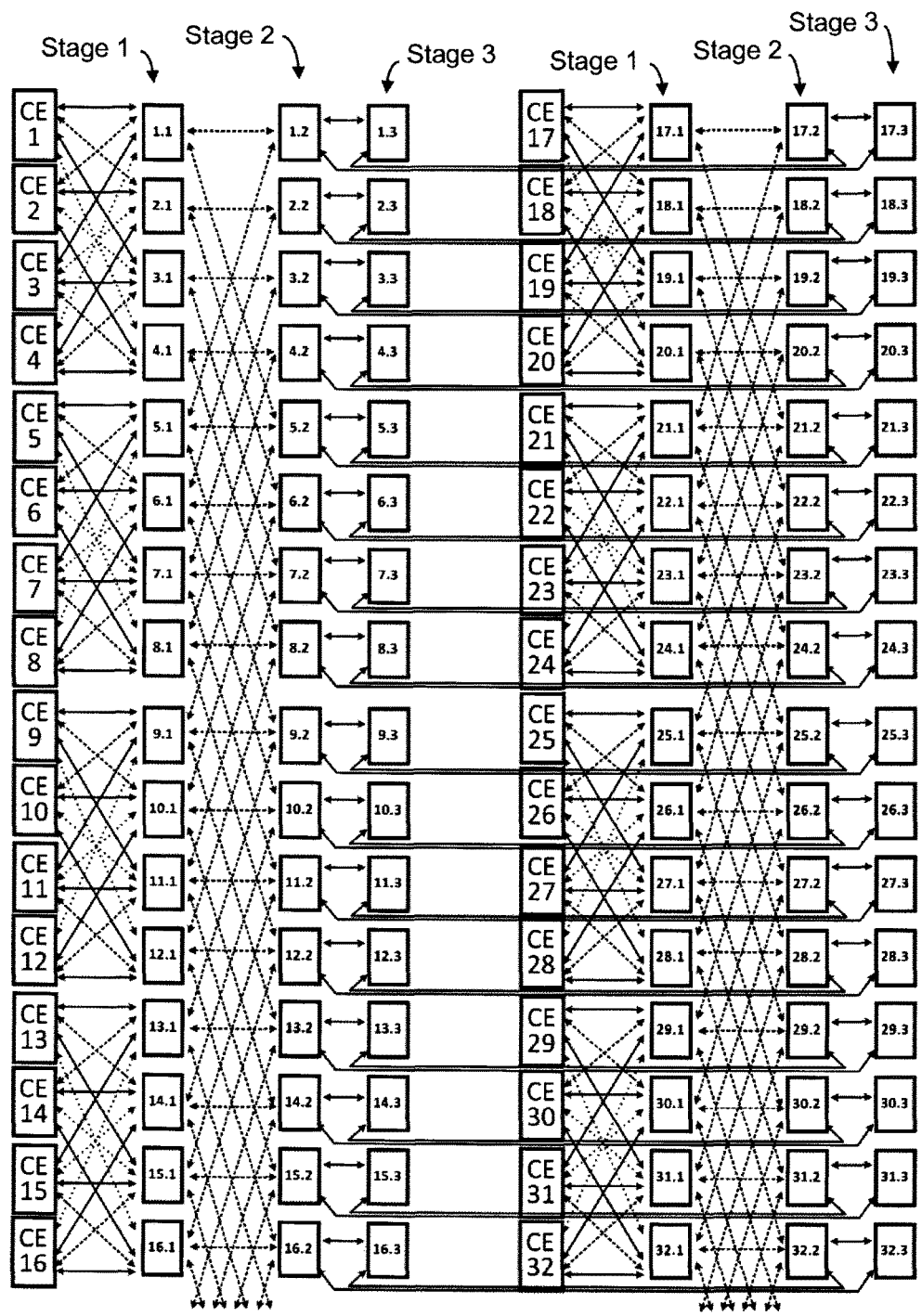
FIG. 4A illustrates another exemplary mixed-radix and mixed-mode interconnect architecture embodiment according to at least one aspect of the present inventions, wherein each switch matrix of Stage 1 (SM1) is a radix-4
Figure 4B:
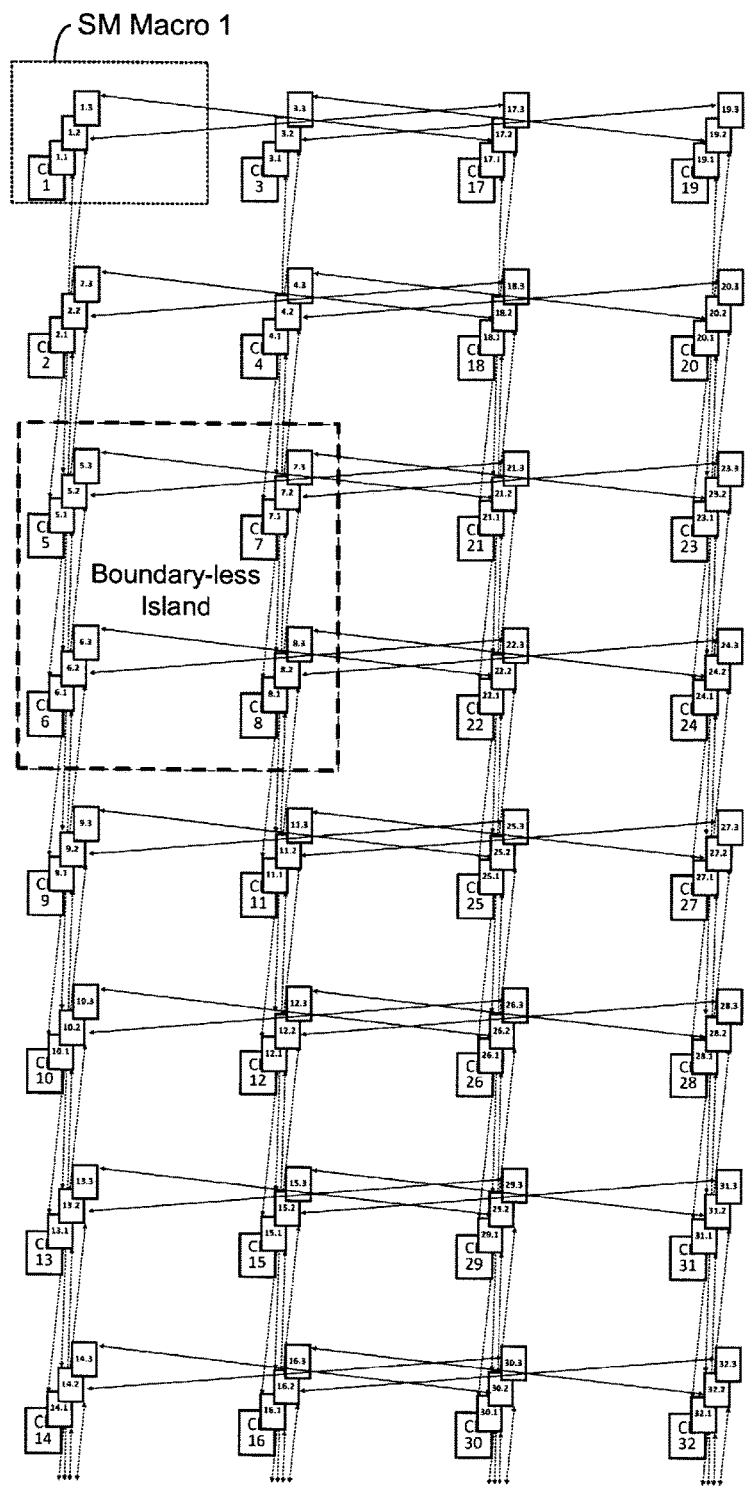
Figure 5A:
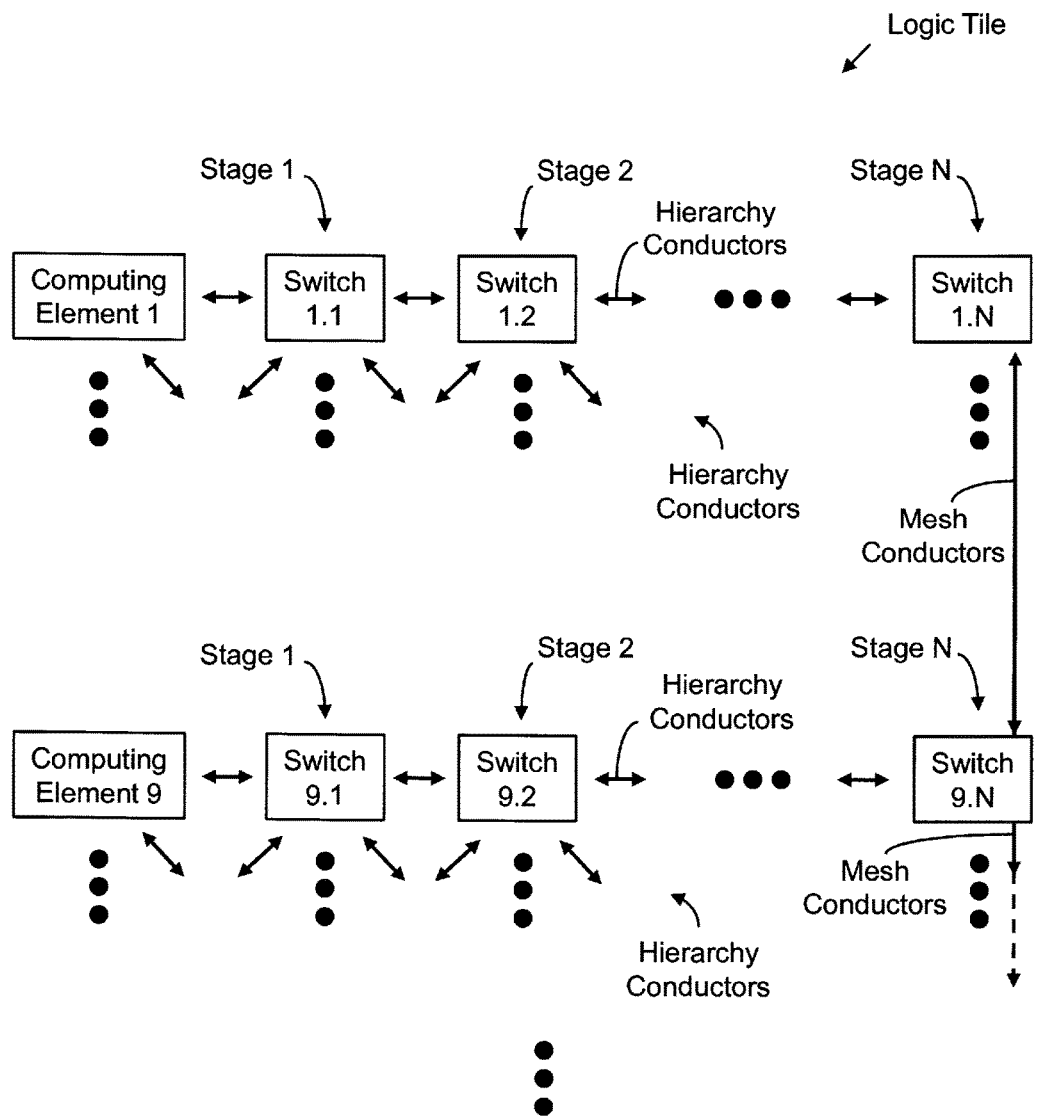
Figure 5B:
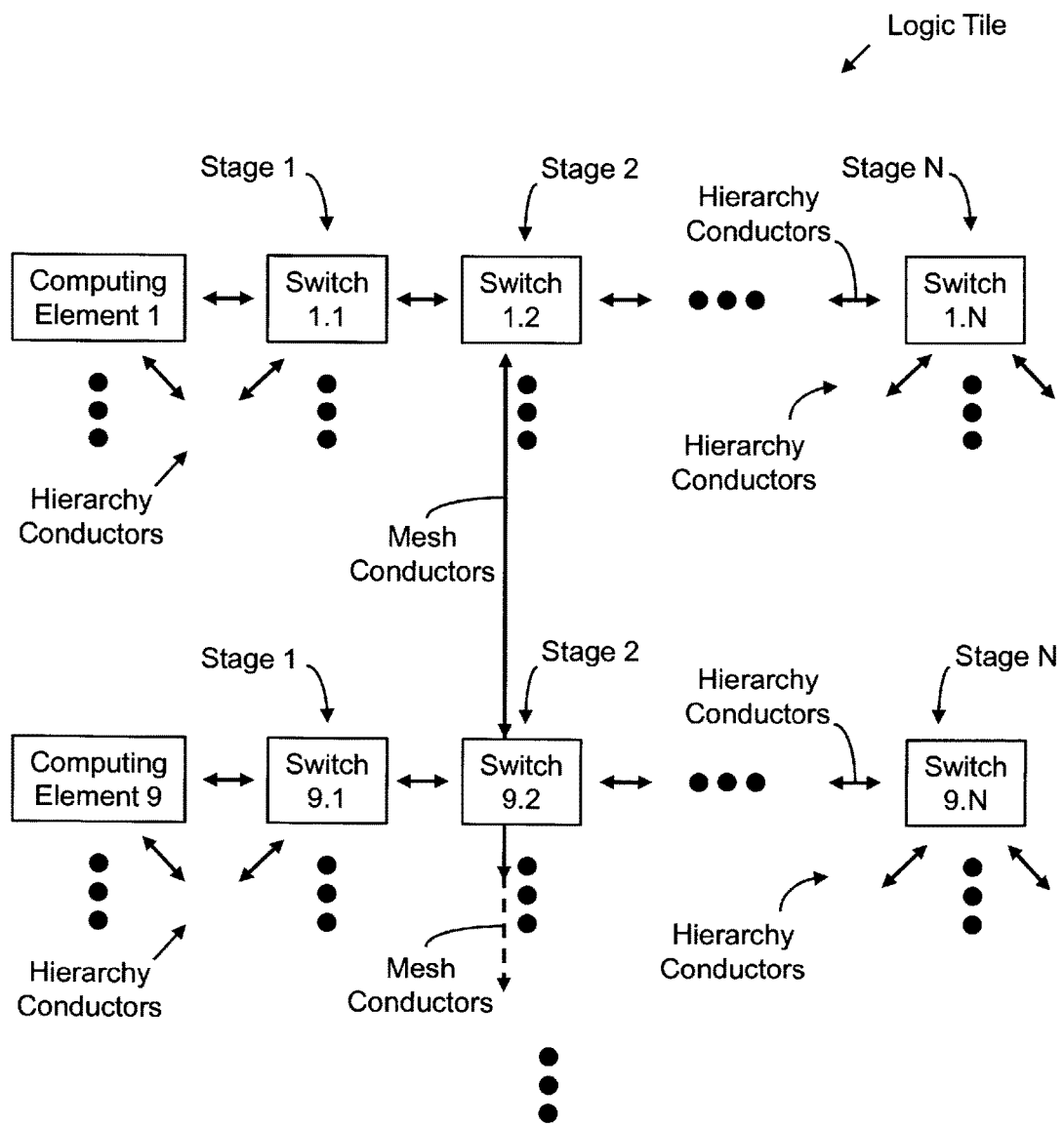
Figure 5C:
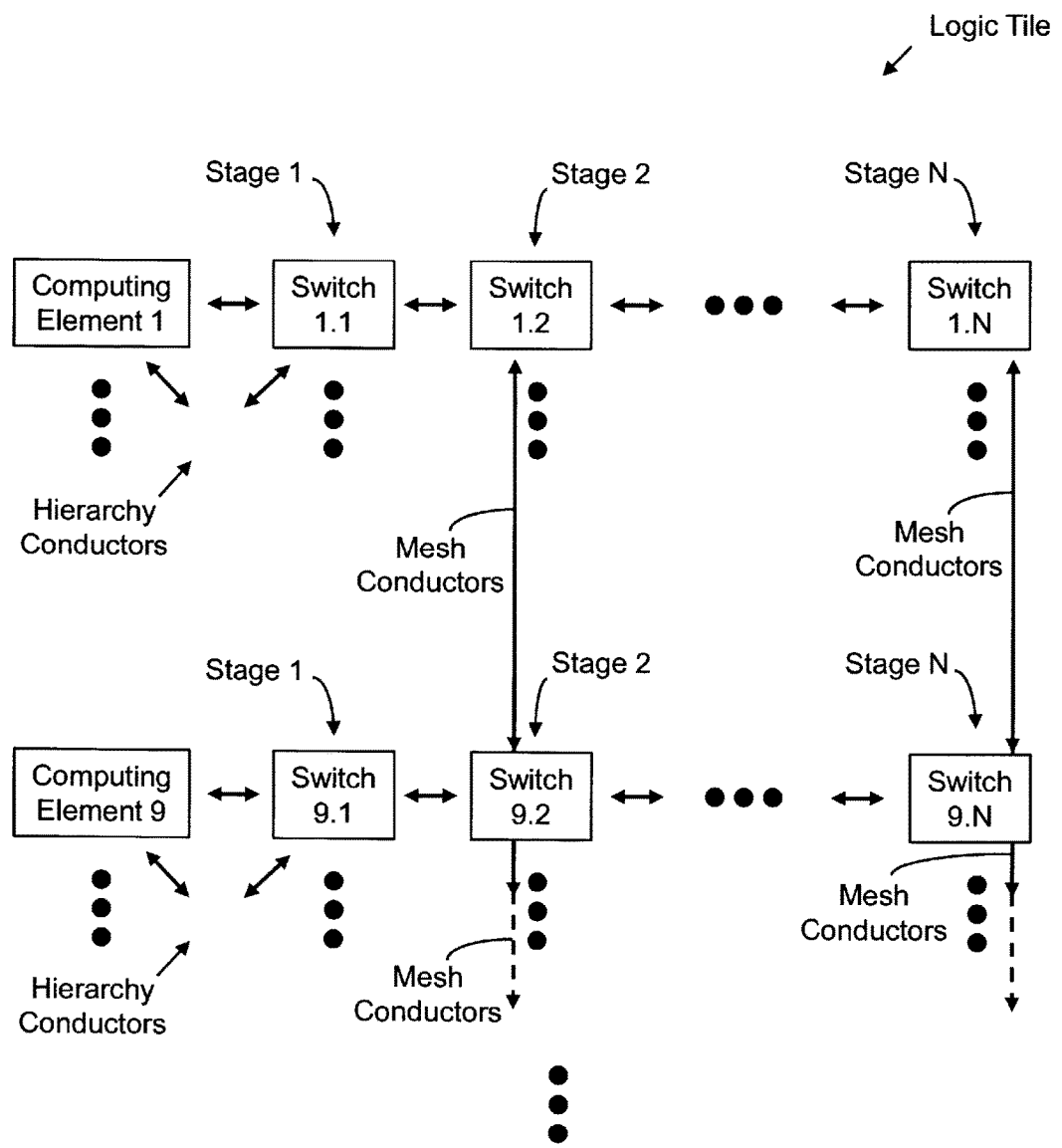
Figure 6A:
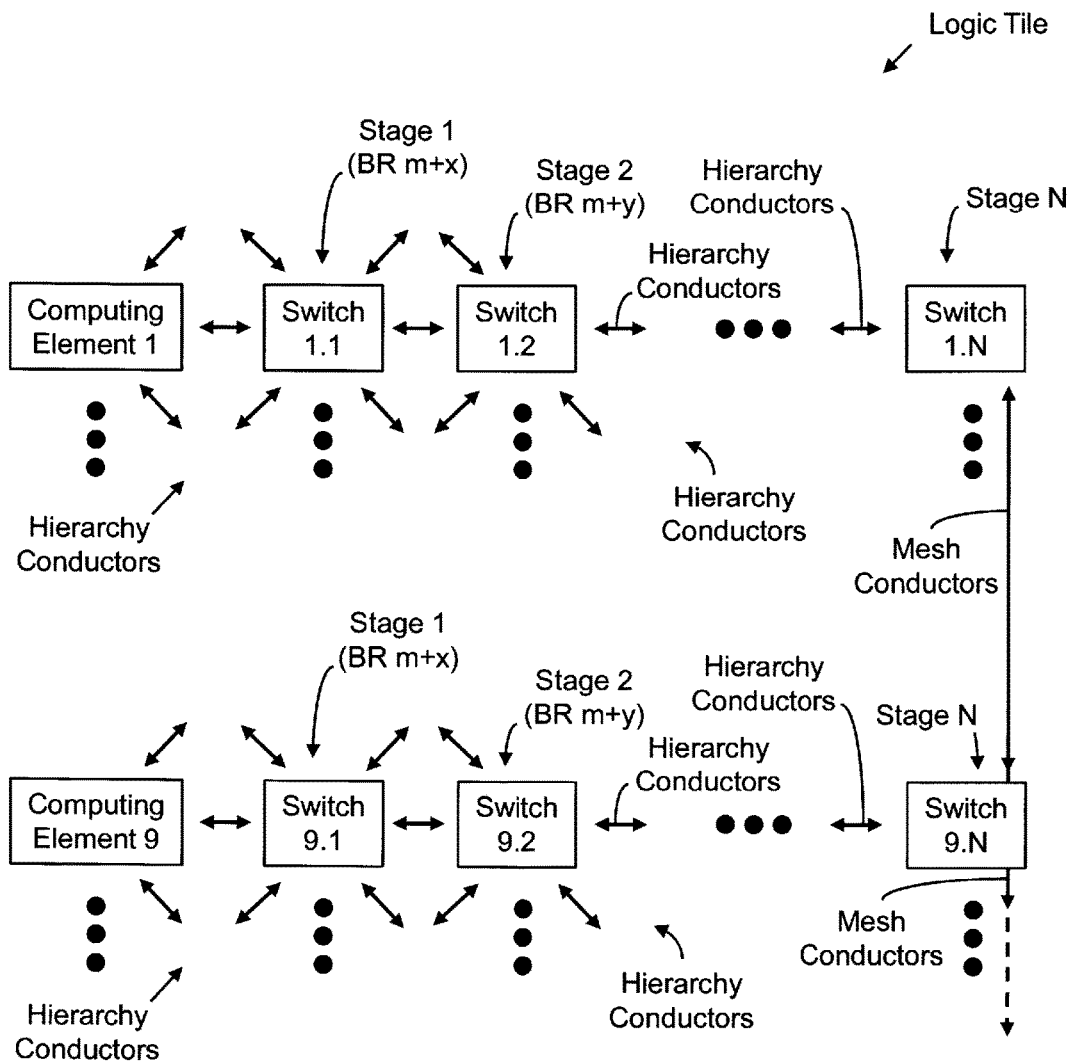
Figure 6B:
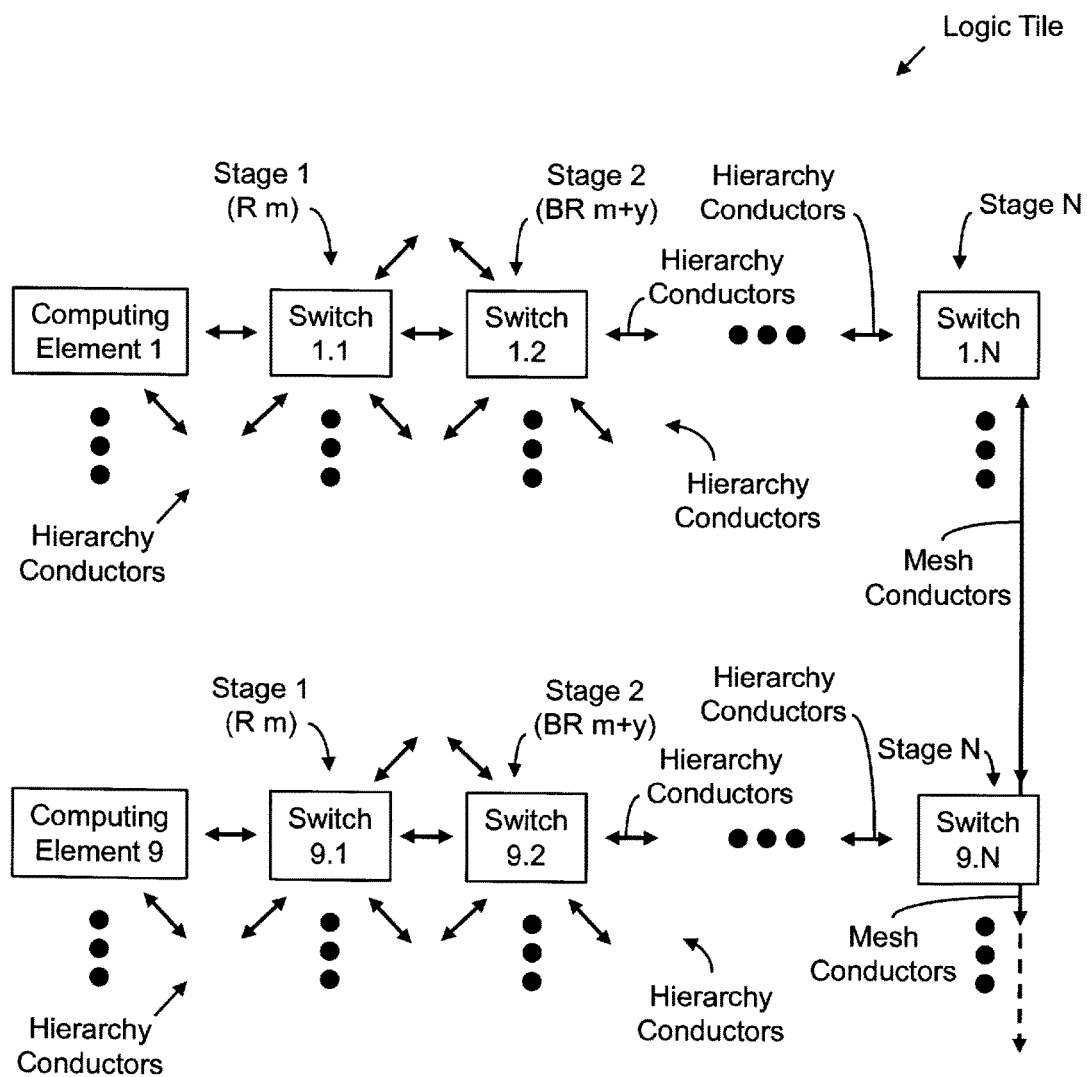
Figure 6C:
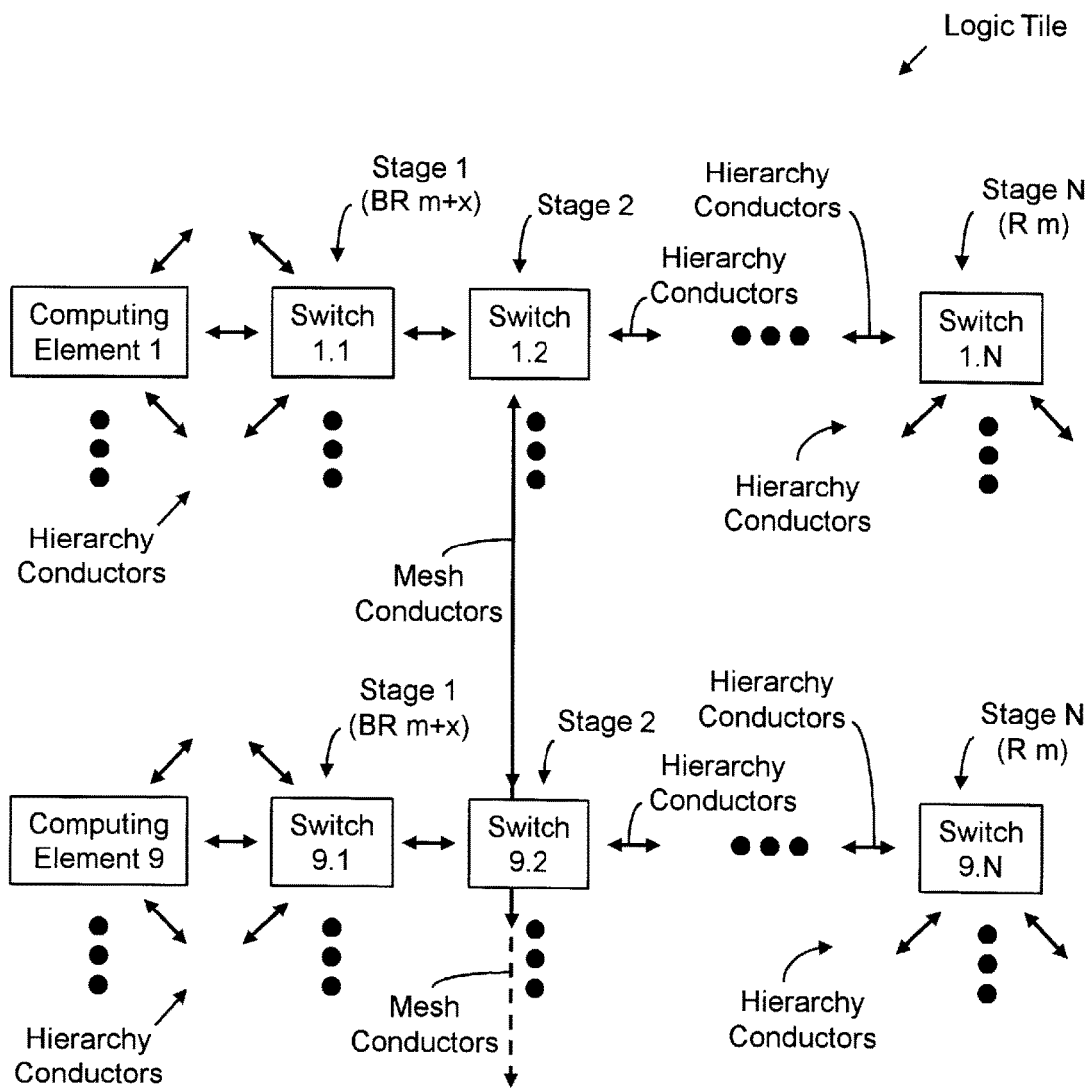
Figure 6D:
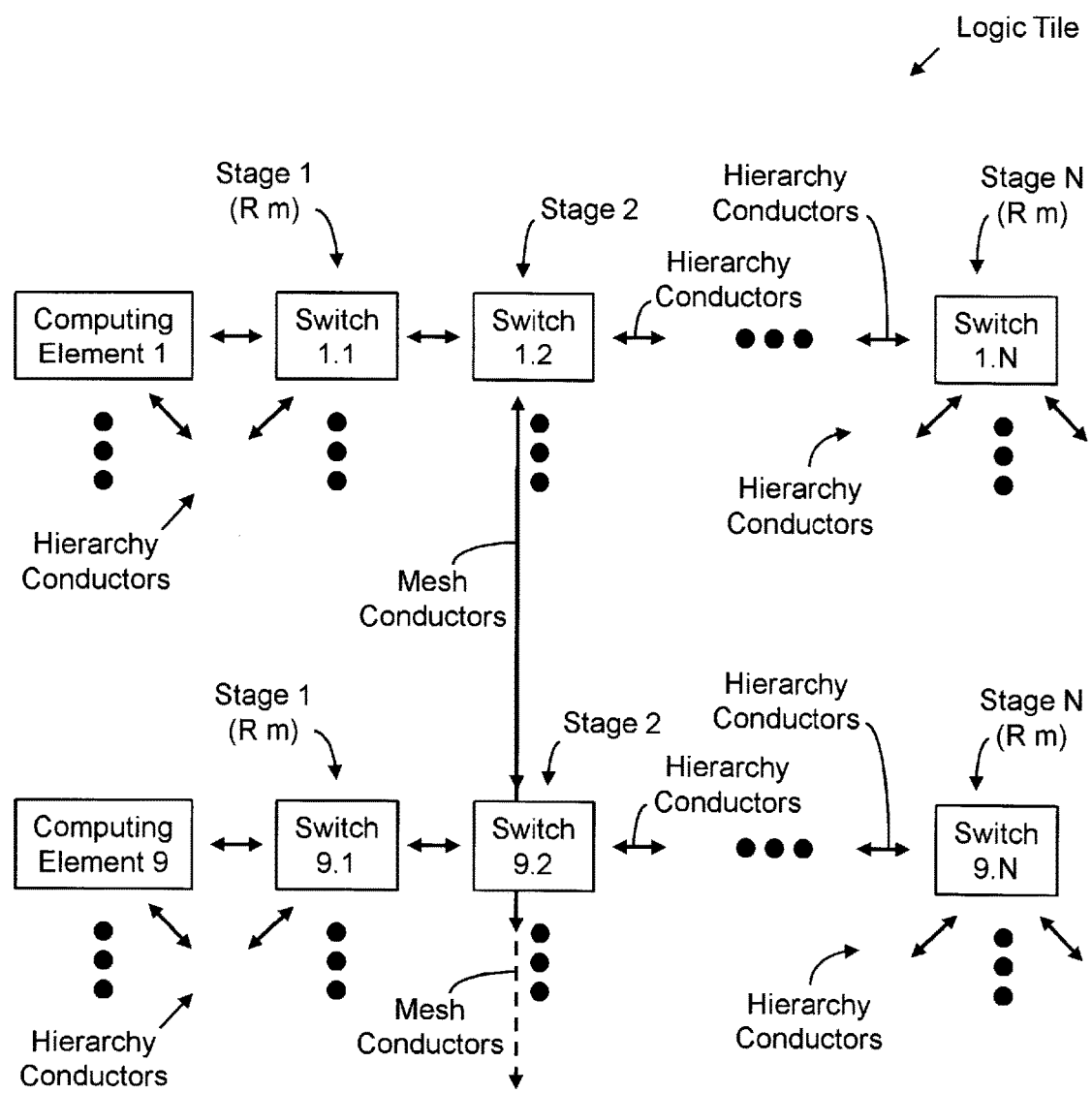
Figure 7A:
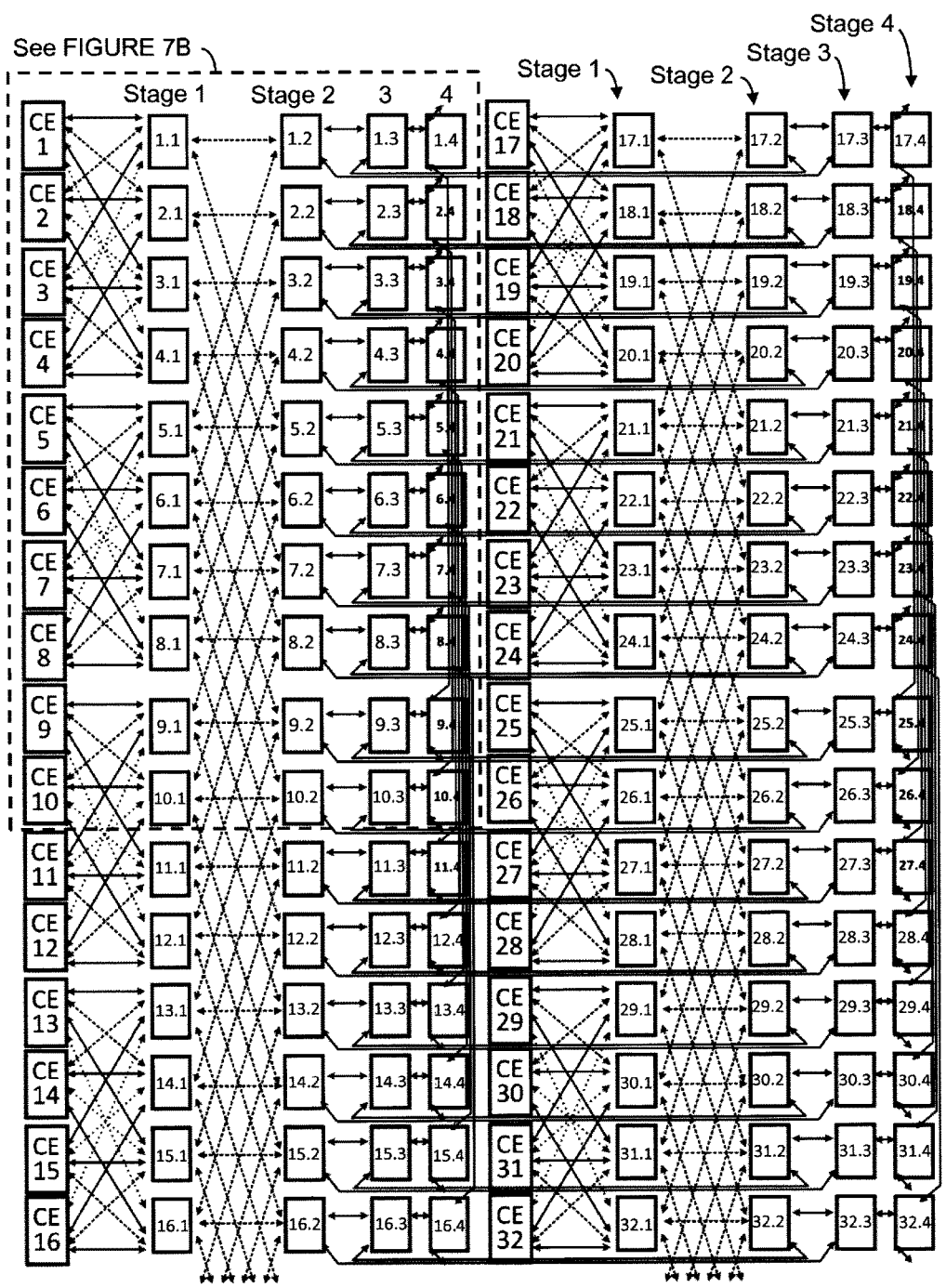
Figure 7B:
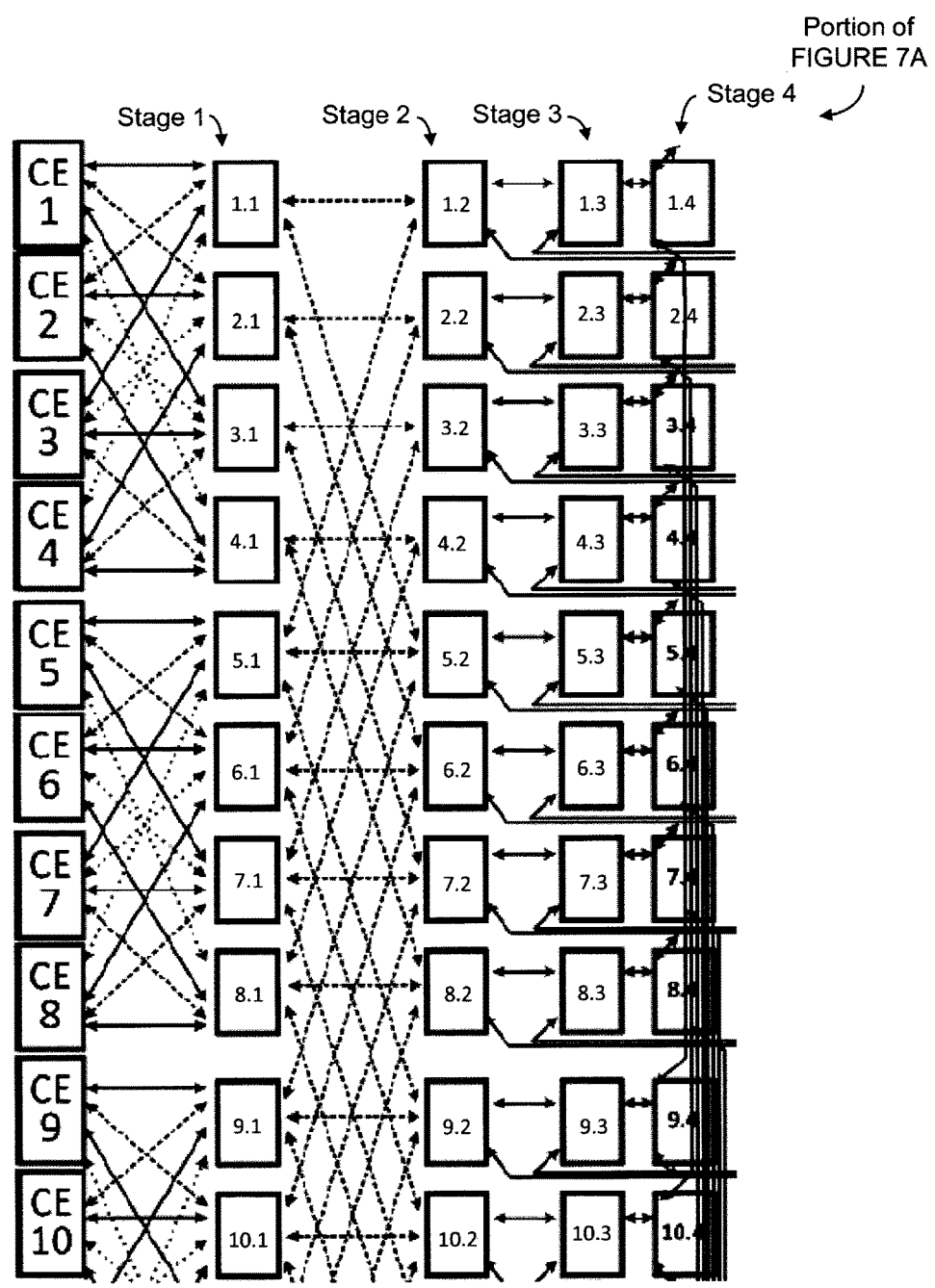
Figure 7C:
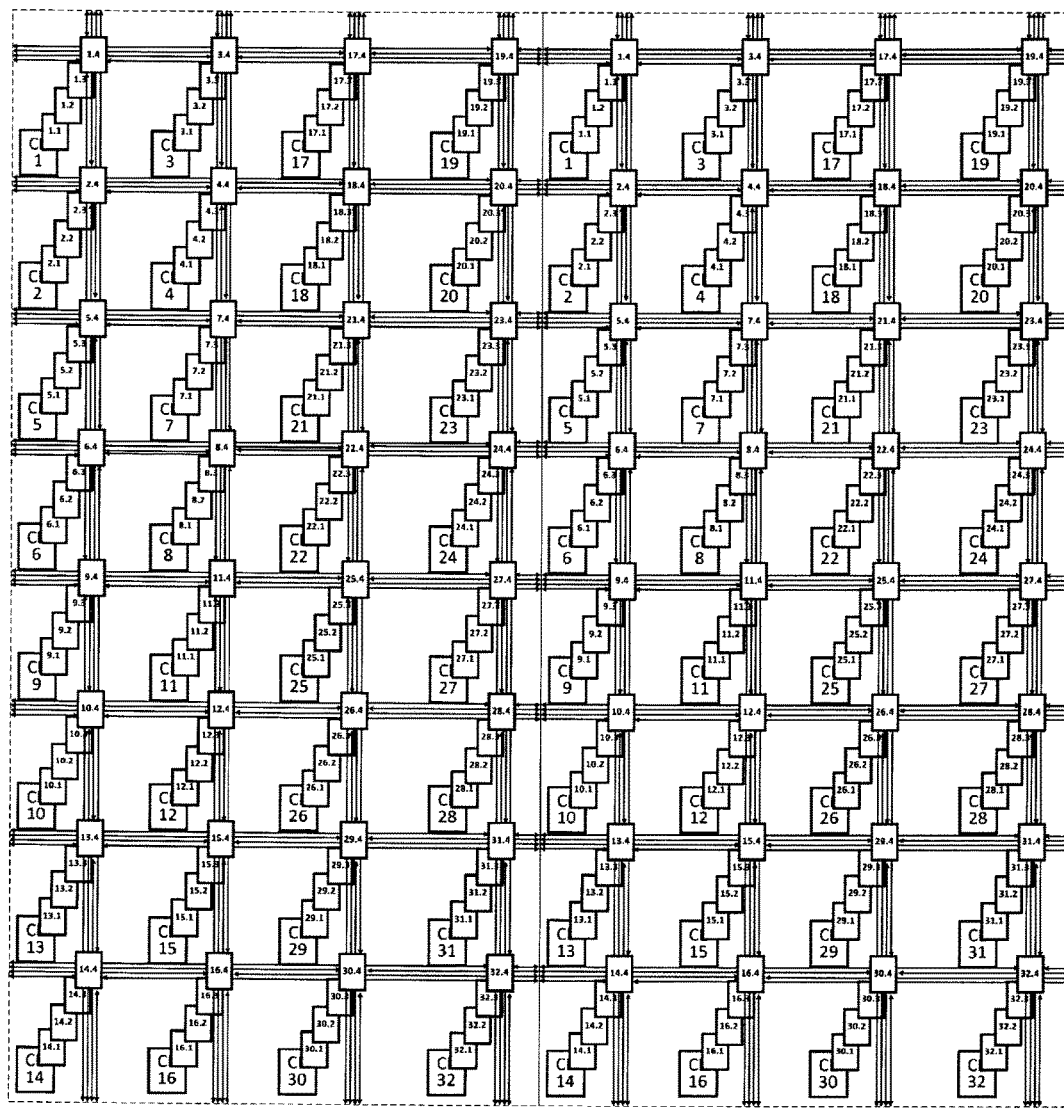

(CE↔SM1), each switch matrix of Stage 2 (SM2) is a boundary-less radix-3 (BR3) (SM1↔SM2), and each switch matrix of Stage 3 (SM3) is a radix 2 (SM2↔SM3); notably, a boundary-less radix-3 (BR3) network may be a preferred network for one or more SM Stages of the logic tile; here, unlike traditional radix-based networks, BR3 interconnects/ networks maintain spatial locality between each computing element (CE) (or SM macro) and its nearest neighbors and may improve path diversity (more or greater path diversity often means or leads to fewer or less routing resource requirements because of a greater number of interconnect paths), and often requires fewer SM stages to make a connection compared to a radix-2 (R2) network; this notwithstanding, in a preferred embodiment, a boundary-less radix-3 (BR3) interconnect/network is employed in switch matrix stage(s) located or disposed in the lower hierarchies (e.g., SM Stage 1, 2 or 3);

FIG. 4B illustrates, in block diagram form, interconnects of SM Stage 2 (SM2) and SM Stage 3 (SM3) of the exemplary mixed-radix interconnect architecture of FIG. 4A wherein SM1↔SM2 is boundary-less radix-3 (BR3) and SM2↔SM3 is radix-2 (R2); the switch matrices of Stage 2 (SM2) travel horizontally, vertically and/or diagonally to communicate with neighboring switch matrices, and the switch matrices of Stage 3 traverse horizontally; again, implementations of the layout in an integrated circuit do not currently allow diagonal routing and, as such, such routing is rectilinear (which is a well-known rule in integrated circuit layout); notably, in the illustrated 2-D layout, each 4 CEs and SM macros are connected via or through the switch matrices of SM Stage 1;

FIGS. 5A-5C illustrate simplified exemplary schematic block diagram representations of exemplary mixed-mode interconnect architectures of a programmable logic tiles, according to at least one aspect of the present inventions, including a plurality of computing elements (for example, a look-up-table, processor circuit, controller circuit and/or combinational logic circuit); in this illustrative embodiment, switch matrices of certain stages are configured in a hierarchical network of one or more radices and other switch matrices are configured in a mesh network according to at least one aspect of the present inventions, for example, in FIG. 5A, switch matrices of Stages 1 and 2 are configured in a hierarchical architecture and switch matrices of Stage N are configured in a mesh architecture wherein, as a mesh architecture (and unlike a hierarchical architecture), the outputs of the switches of Stage N are routed to selected other switches of Stage N—that is, the output routing remains within Stage N (see, FIG. 5A wherein the signal travels between switches 1.N and 9.N, and thereafter the signal may travel within the other Stages connected to the mesh network—e.g., to the CE by entering the hierarchical network via Stage N-1) (see also, FIG. 5B wherein the signal travels between switches 1.2 and 9.2, and thereafter the signal may travel within the other Stages connected to the mesh network—e.g., to the CE by entering the hierarchical network via Stage 1); further, in FIG. 5C, switch matrices of Stage 1 is configured in a hierarchical architecture (and other Stages may as well) and switch matrices of Stages 2 and N are configured in a mesh architecture wherein, as a mesh architecture (and unlike a hierarchical architecture), the outputs of the switches of Stages 2 and N are routed to selected other switches of Stages 2 and N, respectively—that is, the output routing remains within Stage 2 and Stage N, respectively; the switch matrix/matrices of the stage(s) (and the switches thereof) that are configured in a hierarchical network are interconnected via hierarchy conductors and the switch matrix/matrices of the stage(s) (and the switches thereof) that are configured in a mesh network are interconnected via mesh conductors; notably, each bidirectional wire may be a single conductor or multiple sets of unidirectional wires/conductors and much of the detailed interconnections between switch matrices of the stages have been eliminated for purposes clarity;

FIGS. 6A-6D illustrate exemplary mixed-radix, mixed-mode interconnect architectures (i.e., a plurality of switch matrix (SM) stages implementing either hierarchical or mesh interconnects) according to at least one aspect of the present inventions according to at least one aspect of the present inventions; notably detailed interconnections between switch matrices of the stages have been eliminated for purposes clarity; moreover, in the illustrated simplified exemplary schematic block diagram representations exemplary mixed-radix interconnect architectures of a programmable logic tile of FIGS. 6A-6D, m, x and y are integers and "BR" indicates a boundary-less radix interconnect (e.g., BR3 where m=2 and x=1) and "R" indicates a radix interconnect (e.g., R2, m=2);

FIG. 7A illustrates an exemplary mixed-radix, mixed-mode interconnect architecture according to at least one aspect of the present inventions according to at least one aspect of the present inventions, wherein each switch matrix of Stage 1 (SM1) is a radix-4 (CE↔SM1), each switch matrix of Stage 2 (SM2) is a boundary-less radix-3 (SM1↔SM2), each switch matrix of Stage 3 (SM3) is a radix-2 (SM2↔SM3) and each switch matrix of Stage 4 (SM4) is connected in a mesh architecture;

FIG. 7B illustrates a selected portion of FIG. 7A as indicated in the illustration of FIG. 7A; and FIG. 7C illustrates, in block diagram form, the mesh connections of Stage 4 of the exemplary embodiment of FIG. 7A (notably, the lower three stages of the embodiment of FIG. 7A are illustrated in the mix-radix hierarchical network of FIGS. 4A and 4B; here, a signal output by the switches of Stage 4 do not change hierarchy as they propagate through the mesh network; that is, a signal may travel from switch 1.4 to switch 9.4 of array 1, then to switch 9.4 and switch 17.4 of array 2, and then back to switch 1.4 of array 1 if the router configures the network of the integrated circuit appropriately; notably, a mesh-style network is tileable and the 32-element design of FIG. 6A may be considered as a tile-able macro, which may be replicated to make larger arrays (provided the mesh network provides sufficient bandwidth, else a new mesh network with more resources needs to be designed); although in the illustrative embodiment of FIGS. 7A-7C hierarchical networks/interconnects are currently employed in the other switch matrix (SM) stages (i.e., Stages 1, 2 and 3), another mesh network may be implemented as a substitute and replacement of one or more of the hierarchical stages (e.g., Stage 2 may be a mesh network (see FIG. 5B) or Stages 2 and 4 may be replaced by a mesh network (see FIG. 5C) that "hops" horizontally and vertically, in addition to the current Stage 4 mesh that "hops" by 4 in each direction).

Again, there are many inventions described and illustrated herein. The present inventions are neither limited to any single aspect nor embodiment thereof, nor to any combinations and/or permutations of such aspects and/or embodiments. Each of the aspects of the present inventions, and/or embodiments thereof, may be employed alone or in combination with one or more of the other aspects of the present inventions and/or embodiments thereof. For the sake of brevity, many of those combinations and permutations are not discussed separately herein.

DETAILED DESCRIPTION

The present inventions are directed to an integrated circuit having a mixed-radix and/or mixed-mode switch matrix interconnect architectures for implementation in/on, for example, integrated circuits (for example, a processor, controller, state machine, gate array, PGA, FPGA and SOC).

With that in mind, in one aspect, the present inventions are directed to an integrated circuit having a mixed-radix hierarchal interconnect architecture. In one embodiment, an integrated circuit includes a plurality of computing elements (for example, a look-up-table, processor circuit, controller circuit and/or combinational logic circuit) wherein each computing element is associated with plurality of switch matrices which are configured in at least two different radices in relation to an interconnect network of the switch matrices associated with other computing elements of the integrated circuit. For example, the switch matrices of a first stage (which are directly connected to one or more associated computing elements) are configured in a first radix interconnect (for example, radix-4), the switch matrices of a second stage are configured in a second radix interconnect (for example, boundary-less radix-3), the switch matrices of a third stage are configured in a third radix interconnect (for example, boundary-less radix-3 or radix-2) and the switch matrices of a fourth stage are configured in a fourth radix interconnect (for example, radix-2).

Figure 1A:
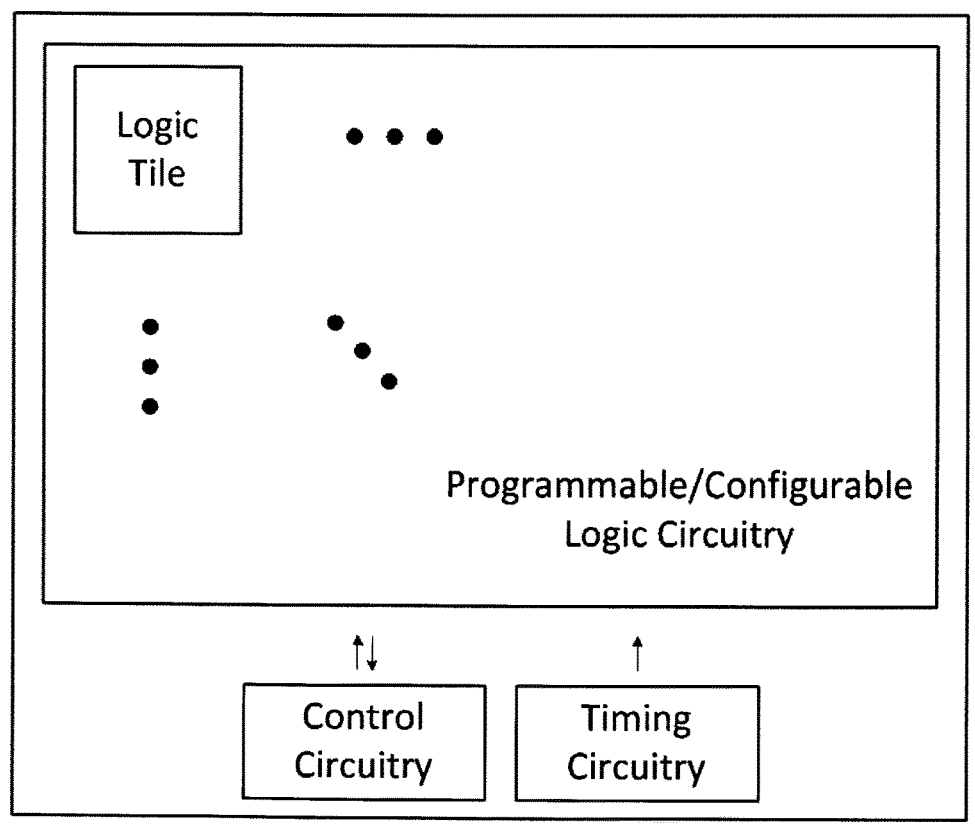
FIG. 1A illustrates a block diagram representation of, for example, an integrated circuit including control circuitry, clock circuitry and programmable/configurable logic circuitry (which may include one or more logic tiles, each of which includes logic transistors (that may be interconnected, for example, as switches or multiplexers having two or more inputs which are electrically coupled to associated memory cells that, when programmed, determine the operation of the switches or multiplexers))
Figure 1B:
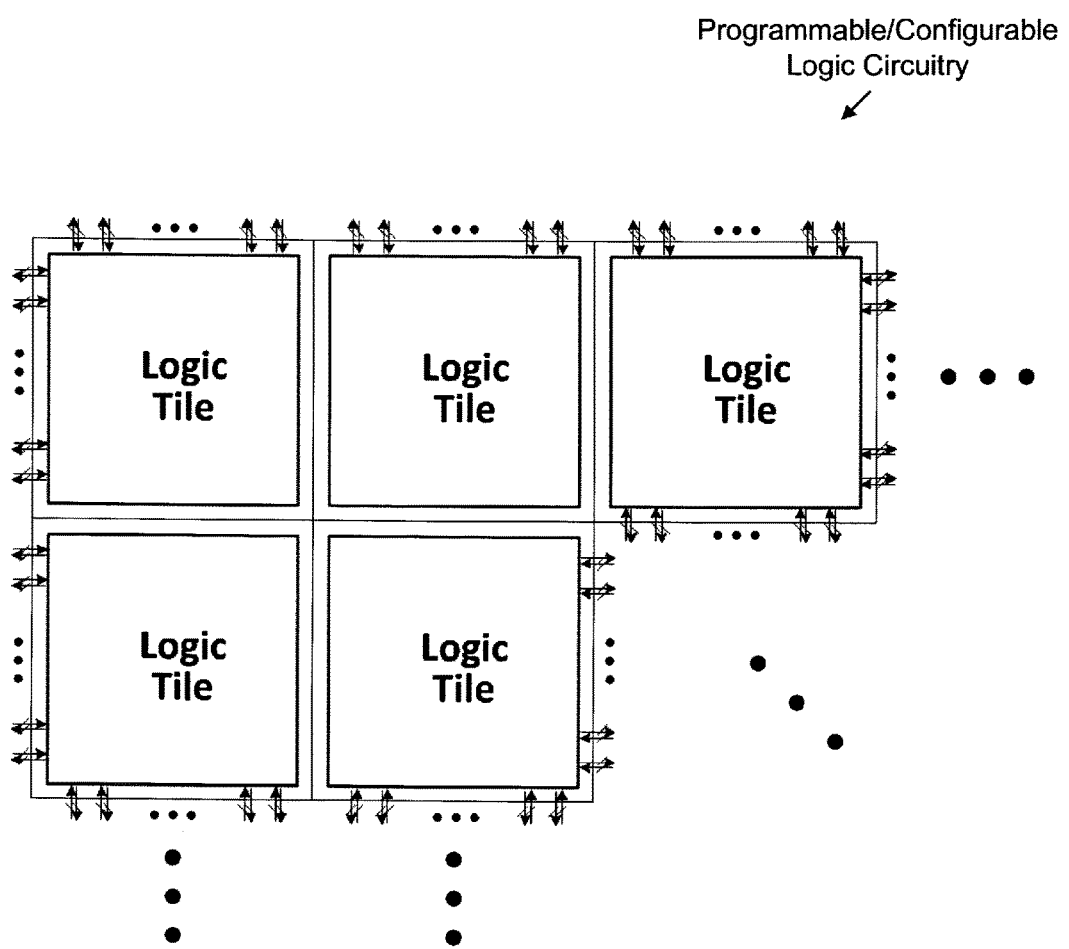
FIG. 1B illustrates a block diagram representation of a plurality of interconnected logic tiles of programmable/configurable logic circuitry, for example, an FPGA, wherein input/output of the logic tiles may facilitate communication between logic tiles and/or circuitry external to the programmable/configurable logic circuitry; notably, the programmable/configurable logic circuitry may be comprised of a plurality of programmable logic tiles wherein at least one such tile includes a mixed-radix and/or mixed-mode switch matrix interconnect architecture.
Figure 1C:
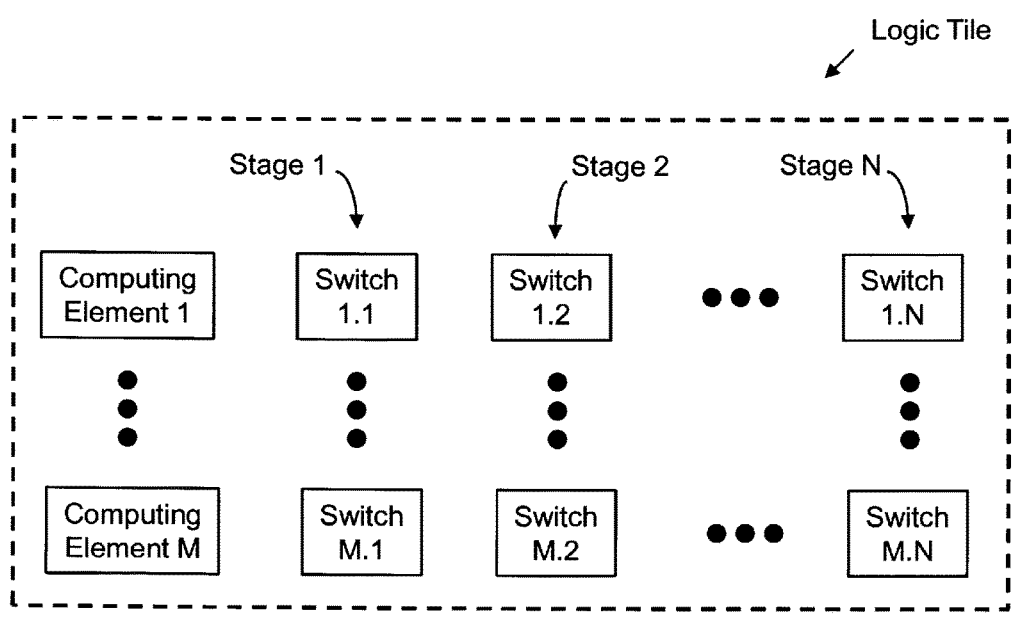
FIG. 1C illustrates a block diagram representation of an M×N array of switch matrices, without detailed illustration of interconnection, of an exemplary programmable logic tile of programmable/configurable logic circuitry, for example, an FPGA.
Figure 2A:
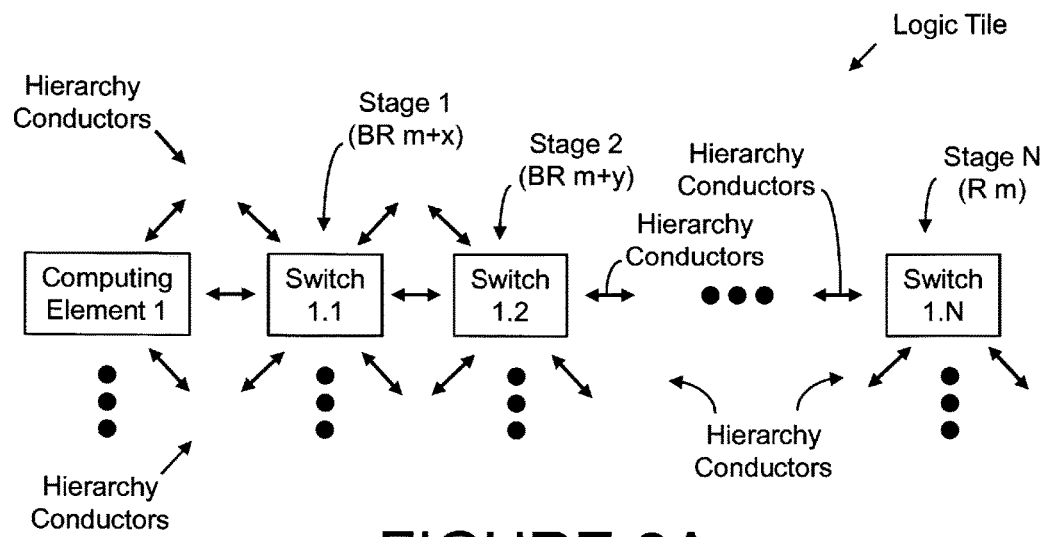
FIGS. 2A and 2B illustrate simplified exemplary schematic block diagram representations exemplary mixed-radix interconnect architectures of a programmable logic tile, according to at least one aspect of the present inventions, including a plurality of computing elements (for example, a look-up-table, processor circuit, controller circuit and/or combinational logic circuit) wherein each computing element is associated with plurality of switch matrices (organized in switch matrix (SM) Stages) which are configured in hierarchical network (interconnected via hierarchy conductors) having at least two different radices, according to at least one aspect of the present inventions; such radices of the switch matrices of a Stage may or may not be boundary-less (compare the switch matrices of Stage 2 to Stage 1 or Stage N of FIGS. 2A and 2B); notably, each bidirectional wire or conductor may be a single conductor or two sets of unidirectional conductors/wires, or multiple sets of bi-directional or uni-directional conductors/wires, and certain detailed interconnections between matrices of the stages have been eliminated for purposes clarity; the switch matrices of the stages (and the switches thereof) that are configured in a hierarchical network are interconnected via hierarchy conductors; moreover, in the illustrated simplified exemplary schematic block diagram representations exemplary mixed-radix interconnect architectures of a programmable logic tile of FIGS. 2A and 2B, m, x and y are integers and "BR" indicates a boundary-less radix interconnect (e.g., BR3 where m=2 and x=1) and "R" indicates a radix interconnect (e.g., R2 where m=2)
Figure 2B:
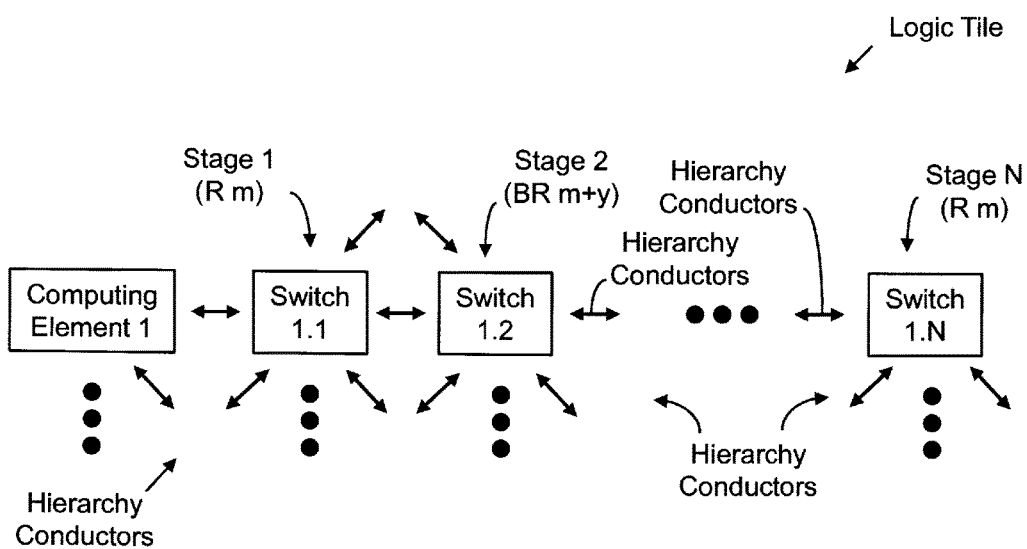

With reference to FIGS. 2A and 2B, the hierarchal interconnect network may include a plurality of switch matrix stages (Stages 1, 2 . . . N) that are configured in two or more different radix or boundary-less radix interconnects. The mixed-radix interconnect architecture include hierarchy conductors to connect the switch matrices and computing elements—albeit detailed interconnections between switch matrices of each stage have been eliminated for purposes clarity. The design of the interconnect may depend on a plurality of tradeoffs including, for example, operating/response speed of the network, switching time of the matrices, die area considerations/constraints of the network and conductor routing considerations/constraints.

Figure 3A:
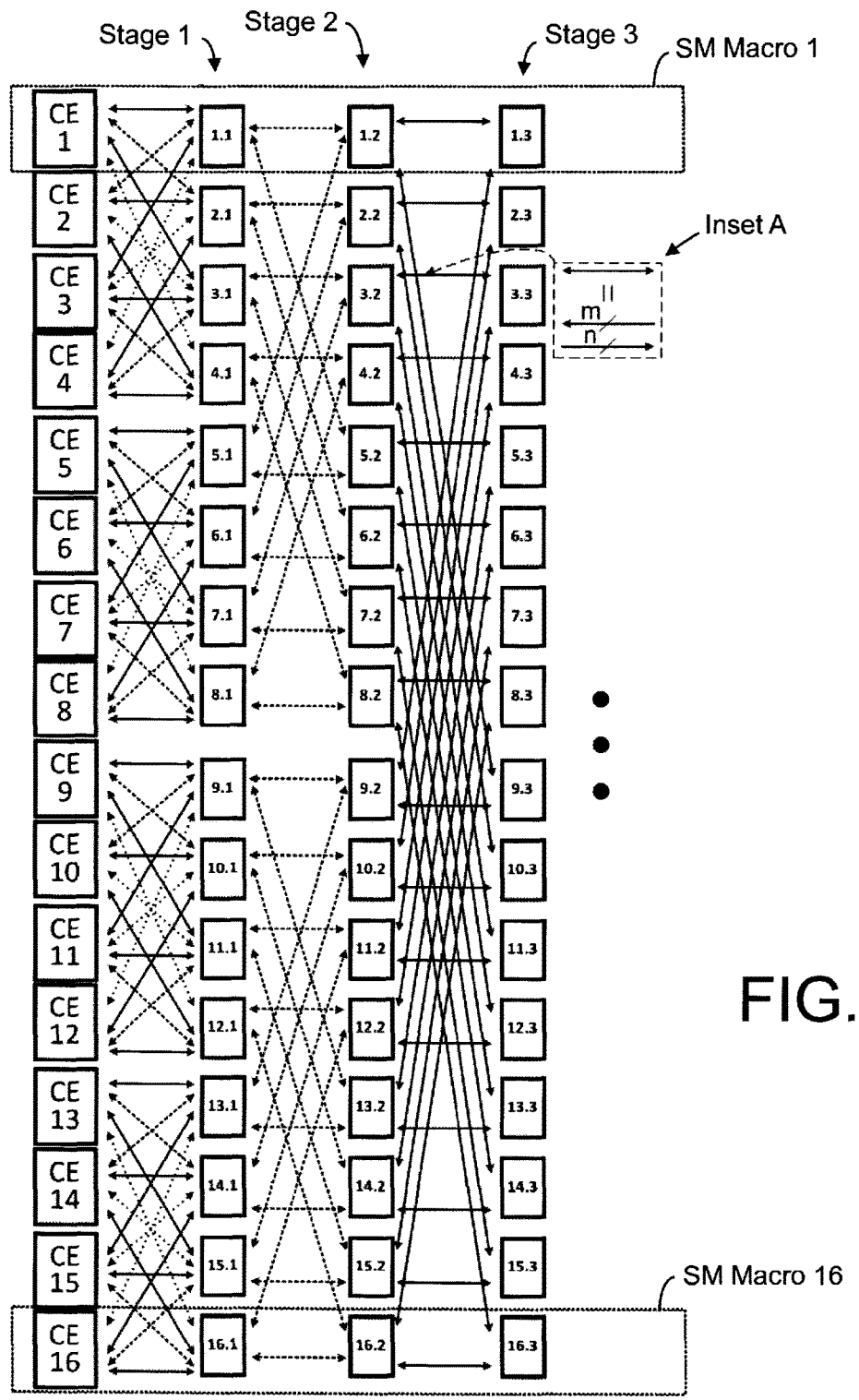
FIG. 3A illustrates an exemplary mixed-radix interconnect architecture embodiment according to at least one aspect of the present inventions, wherein each switch matrix of Stage 1 (SM1) is a radix-4 (CE↔SM1) and each switch matrix of Stage 2 (SM2) and Stage 3 (SM3) is a radix 2 (SM1↔SM2 and SM2↔SM3, respectively); notably, each bidirectional wire may be two sets of uni-directional wires (see dotted box labeled Inset A)—one set of m downstream wires (propagating towards the computing element ("CE") input), and one set of n upstream wires (propagating away from the CE output); the m and n for each wire segment may or may not be equal to that of any other wire segment, nor does it need to equal the m and n of the CE inputs and outputs; however, unless otherwise specified, the same m and n may be employed for the entire network; further, an IC designer may create a SM macro (see box labeled "SM Macro 1") and then instantiate the same SM macro ×16 times and connect all the outward-branching connections between the SM macros.
Figure 3B:
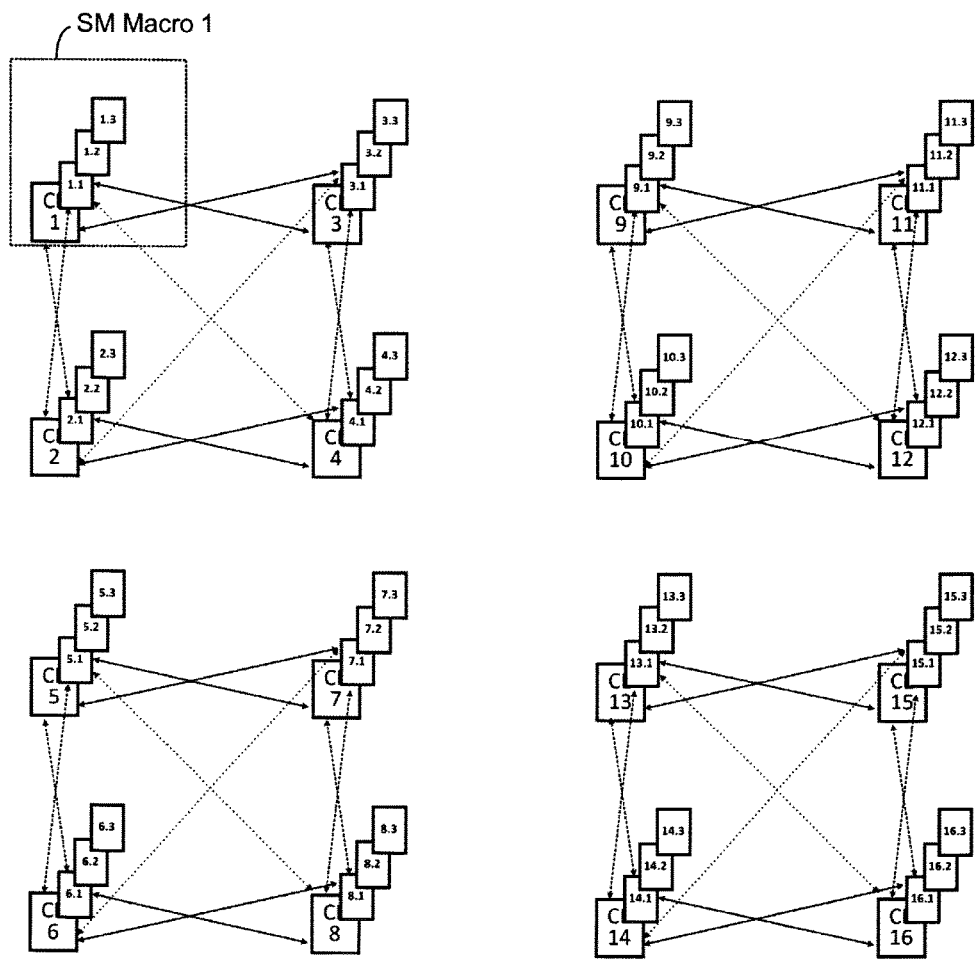
FIG. 3B illustrates, in block diagram form, selected interconnects of the exemplary mixed-radix interconnect architecture of FIG. 3A wherein the SM Stage 1 (SM1) (CE↔SM1) is a radix-4 connection and each switch matrix travels horizontally, vertically and diagonally to communicate with three neighboring switch matrices; notably, silicon implementations do not currently permit diagonal routing (which is drawn diagonally for purposes of interconnection clarity) and, as such, diagonal routing is, in implementation, rectilinear wherein the length of the illustrated diagonal wires are typically the sum of the lengths horizontal and vertical routes.
Figure 3C:
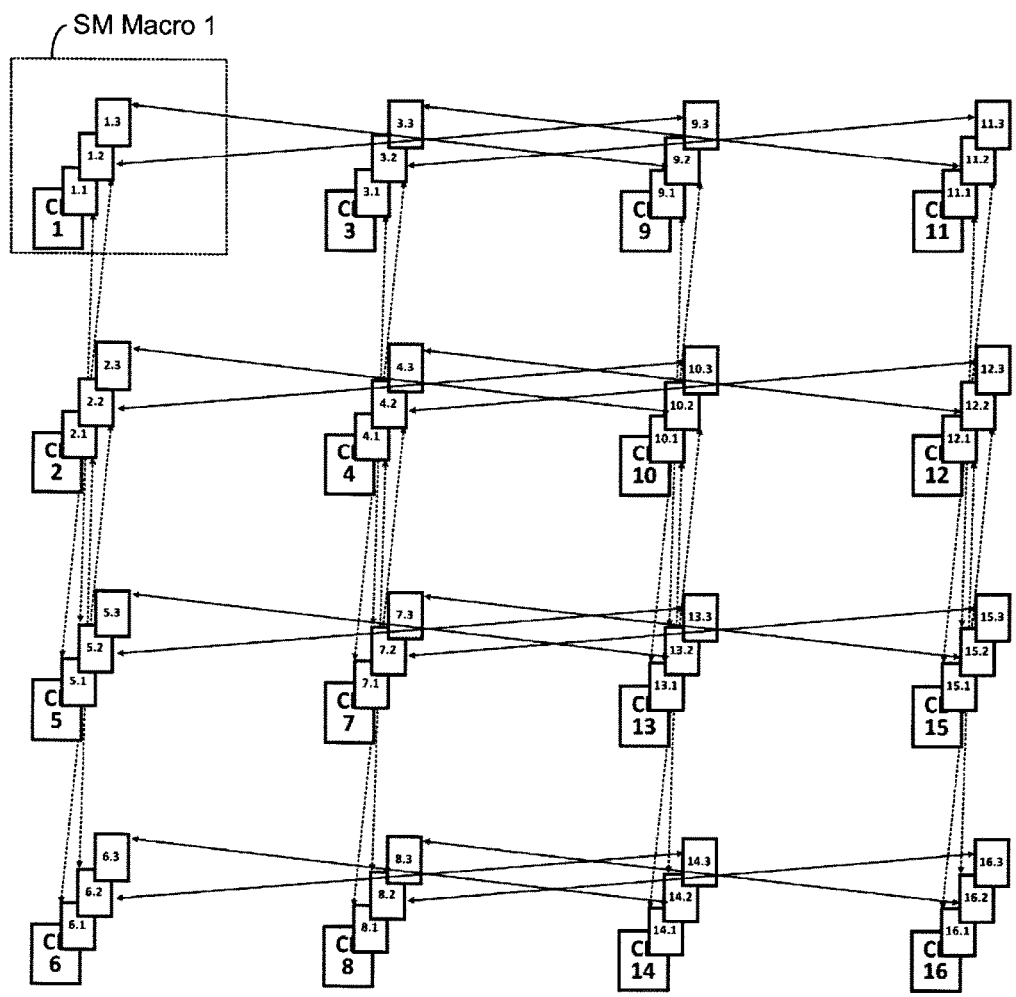
FIG. 3C illustrates, in block diagram form, interconnects of SM Stage 2 (SM2) and SM Stage 3 (SM3) of the exemplary mixed-radix and mixed-mode interconnect architecture of FIG. 3A wherein each switch matrix is a radix-2 (SM1↔SM2 and SM2↔SM3) and each switch matrix travels horizontally, vertically and/or diagonally to communicate with neighboring switch matrices (via associated the interconnections); again, silicon implementations do not currently permit diagonal routing and, as such, such routing is, in implementation, rectilinear (which is a well-known rule in integrated circuit layout)

For example, with reference to FIGS. 3A-3C, in one exemplary embodiment, it may be advantageous to employ a radix-4 interconnect (Stage 1), in comparison to radix-2 (R2) interconnects, in order to reduce the switching time (which may provide in a faster network) because a radix-4 (R4) requires ½ the number of switch matrix (SM) Stages to communicate between four computing elements (CEs)—that is, a radix-4 interconnect network requires one switch matrix (SM) Stage (compared to two switch matrix (SM) Stages in the context of a radix-2 interconnect). This may be balanced against the fact that a radix-4 interconnect requires more wiring resources (e.g. if sufficient wiring resources exist, or the wiring distances are sufficiently short).

Thus, where wiring resources are less of a consideration, it may be advantageous to employ a radix-4 interconnect for Stage 1 (such as short connections, where radix-4 does not result in excessive routing congestion and increase in interconnect power/capacitance). Under these scenarios, a reduction of a SM stage is beneficial. However, in the higher/upper stages, smaller radix may be advantageous (for example, a radix-2 interconnects) due to the fact that radix-2 has lower routing resources relative to radix-4 which may result in or provide reduced wiring congestion, capacitance, and power. Because wire delay typically dominates over switch delay for longer wires, the additional delay incurred in SM Stages becomes a beneficial tradeoff to reduce routing resources.

With reference to FIG. 4A and 4B, in addition to radix-2/4 tradeoffs (of course, higher radices are suitable as well), the boundary-less radix-3 (BR3) interconnect may be well suited to implement with switch matrices organized as radix-4 (R4) and/or radix-2 (R2) interconnects in mixed-radix switch matrix network. Unlike traditional radix-based networks, BR3 networks maintains spatial locality between each computing element (CE) or switch matrix macro (SM macro) and its nearest neighbors and improves path diversity (more path diversity often translates into less routing resource requirements) and may be implemented using fewer switch matrix stages to make required connection (compared to radix-2 networks). However, BR3 network may use more routing resources compared to radix-2—and, as such, it may be advantageous to employ the BR3 interconnect at lower hierarchies (e.g., closer to the computing elements and/or between the computing elements and a switch matrices Stage of radix-2 interconnect).

In this exemplary architecture, radix-4 interconnect is employed as the Stage 1 (CE↔SM1), followed by Stage 2 of BR3 (SM1↔SM2), and followed by Stage 3 of radix-2 network (SM2↔SM3). Notably, certain design-tradeoff include:

- One stage of radix-4 requires 2× the routing resources relative to two stages of radix-2 switches, but requires only one switch delay to reach three of the nearest switch "neighbors".
- One stage of BR3 network requires 2× the routing resources as 1 stage of radix-2 switches. Two stages of BR3 network requires 2× the routing resources as two stages of radix-2 switches, which is same amount of routing resource as 1 stage of radix-4 switch, but requires two switch delays. However, two stages of BR3 switches allow each CE to reach eight "neighbors", while one stage of radix-4 switch allows each CE to only reach three "neighbors".
- One stage of radix-2 switches allows each CE to reach one "neighbor". It requires the fewest routing resources, but requires the most number of switch and therefore switch delays.

Thus, in the exemplary embodiment of FIG. 4A, due to its large resource requirement but fast switches, it may be advantageous to employ radix-4 switches where wiring is short (local routes), for example, for those interconnects in/on the lower or lowest hierarchies—such as, the first or second switch matrix (SM) stages (i.e., SM1 or SM2). Notably, higher radices (8, 16, etc.) may also be employed for the lower SM stage hierarchies (i.e., SM1 and/or SM2). Between the lower or lowest hierarchies/stages and upper or highest hierarchies/stages (e.g., in the middle hierarchies—such as, SM2 and/or SM3), it may be advantageous to employ boundary-less radix-3 (BR3) configuration/interconnects to increase path diversity that facilitates communication to or reaching more neighboring switches without routing to an upper hierarchy, which may improve performance (using fewer stages) and reduce the resource requirements for the upper hierarchies. In the higher or upper hierarchies (e.g., SM3 and/or SM4), which are often dominated by wiring resource considerations, radix-2 (R2) interconnect may be employed which may reduce or minimize wiring resources/lengths.

In another aspect of the present inventions, the integrated circuit includes mixed-mode interconnect architectures wherein (i) the switch matrices of at least one switch stage are configured in a hierarchical network (in relation to the switch stages of the other switch matrices and/or computing elements) and (ii) the switch matrices of at least one stage are configured in a mesh network. For example, in one embodiment, the integrated circuit includes N stage of switch matrices (for example, four stages of switch matrices) including, for example, a first stage of switch matrices (which are directly connected to one or more associated computing elements) configured in hierarchical interconnect/network (for example, radix-4 or radix-3), a second stage of switch matrices (which are connected to switch matrices of the first stage and a third stage of switch matrices) configured in hierarchical interconnects/networks (for example, radix-4 or radix-3), a third stage of switch matrices (which are connected to switch matrices of the second stage and a fourth stage of switch matrices) configured in hierarchical interconnects/networks (for example, radix-3 and radix-2) and the fourth stage configured in a mesh interconnect/network, wherein each switch matrix of the mesh-type interconnect is connected to another switch matrix of the same stage (i.e., the fourth stage).

With reference to FIGS. 5A-5C, exemplary mixed-mode interconnect architectures of a programmable logic tiles, according to at least one aspect of the present inventions, include a plurality of computing elements (for example, a look-up-table, processor circuit, controller circuit and/or combinational logic circuit) and switch matrices of at least one stage are configured in a hierarchical network (in relation to the switch stages of the other switch matrices and/or computing elements) and switch matrices of at least one stage are configured in a mesh network. In these illustrative embodiments, switch matrices of certain stages are configured in a hierarchical network and other switch matrices are configured in a mesh network according to at least one aspect of the present inventions, for example, in FIG. 5A, switch matrices of Stages 1 and 2 are configured in a hierarchical architecture and switch matrices of Stage N are configured in a mesh architecture wherein, as a mesh architecture (and unlike a hierarchical architecture), the outputs of the switches of Stage N are routed to selected other switches of Stage N—that is, the output routing remains within Stage N (see, FIG. 5A wherein the signal travels between switches 1.N and 9.N, and thereafter the signal may travel within the other Stages connected to the mesh network—e.g., to the CE by entering the hierarchical network via Stage N-1) (see also, FIG. 5B wherein switch matrices of Stage 2 are configured in a mesh architecture and, as such, the signal travels between switches 1.2 and 9.2, and thereafter the signal may travel within the other Stages connected to the mesh network via the hierarchical network of Stages 9 . . . N,—e.g., to one or more computing elements by entering the hierarchical network via Stage 1).

Notably, mesh interconnects may be implemented in more than one stage of a logic tile. With reference to FIG. 5C, switch matrices of Stage 1 is configured in a hierarchical architecture (and other Stages may as well) and switch matrices of Stages 2 and N are configured in a mesh architecture wherein, as a mesh architecture (and unlike a hierarchical architecture), the outputs of the switches of Stages 2 and N are routed to selected other switches of Stages 2 and N, respectively—that is, the output routing remains within Stage 2 and Stage N, respectively. Here, for the purposes of clarity, much of the detailed interconnections between switch matrices of the stages have been eliminated. The switch matrices of Stage 3 through Stage N may be configured in a hierarchical architecture (e.g., one or more radix and/or boundary-less radix organizations) or a mesh network architecture (i.e., a mesh, torus or the like network architecture).

Indeed, the mixed mode techniques/interconnects and mixed-radix techniques/interconnects may be implemented together in network of a logic tile. (See, for example, FIGS. 6A-6D). Here, mixed-radix, mixed-mode interconnect architectures (i.e., a plurality of switch matrices (SM) stages implementing either hierarchy or mesh interconnects) provide advantages of mixed-radix interconnects and mixed-mode interconnects wherein the logic tile includes each interconnect. Again, detailed interconnections between switch matrices of the stages have been eliminated for purposes clarity.

With reference to FIGS. 7A-7C, in one exemplary embodiment, the network includes has a mix-radix (with BR3) hierarchical network similar to FIG. 4A for the lower 3 stages (lower stages are those stages that are disposed, positioned or located closer to the computing elements within the architecture) which connects to a mesh-style network for Stage 4. Notably, a key difference for mesh-style architecture is that a signal does not change hierarchy when traversing between switch matrices; that is, the signal may be transmitted to other switches within the switch matrices (SM) of Stage 4. In a hierarchical network, the signal would travel from CE up to the required SM hierarchy, and then travel back down. Here, the signal generally does not travel within the same hierarchy—as in a mesh interconnect. Thus, a mesh-style switch configuration is different (from a switch implemented in a hierarchal configuration), for example, when a signal travels from switch 1.4 to switch 9.4, it remains within switch matrices of Stage 4; thereafter, the signal can then travel somewhere else on the mesh network, or travel downwards towards a CE (for example, CE3) by entering, for example, the switch 3.4 and then propagate within the hierarchical network via Stage 3 (e.g., switches 3.3, 3.2, 3.1 to CE3). (See, for example, FIGS. 7A and 7B).

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the embodiments, features, attributes and advantages of the inventions described and illustrated herein are not exhaustive and it should be understood that such other, similar, as well as different, embodiments, features, attributes and advantages of the present inventions are within the scope of the present inventions.

Indeed, the present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof.

Notably, "circuitry", means, among other things, a circuit (whether integrated or otherwise), a group of such circuits, one or more processors, one or more state machines, one or more processors implementing software, one or more gate arrays, programmable gate arrays and/or field programmable gate arrays, or a combination of one or more circuits (whether integrated or otherwise), one or more state machines, one or more processors, one or more processors implementing software, one or more gate arrays, programmable gate arrays and/or field programmable gate arrays.

The layout, organization and interconnection techniques described herein may be implemented using one or more processors (suitably programmed) to perform, execute and/or assess one or more of the functions or operations of the present inventions.

Notably, various circuits, circuitry, layout and routing disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit, circuitry, layout and routing expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other formats and/or languages now known or later developed. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

Indeed, when received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

Moreover, the various circuits, circuitry, layout and routing, as well as techniques, disclosed herein may be represented via simulations using computer aided design and/or testing tools. The simulation of the inventive circuits, circuitry, layout and routing, and/or techniques implemented thereby, may be implemented by a computer system wherein characteristics and operations of such circuits, circuitry, layout and routing, and techniques implemented thereby, are imitated, replicated and/or predicted via a computer system. The present inventions are also directed to such simulations of the inventive circuits, circuitry, layout and routing, and/or techniques implemented thereby, and, as such, are intended to fall within the scope of the present inventions. The computer-readable media corresponding to such simulations and/or testing tools are also intended to fall within the scope of the present inventions.

Notably, reference herein to "one embodiment" or "an embodiment" (or the like) means that a particular feature, structure, or characteristic described in connection with the embodiment may be included, employed and/or incorporated in one, some or all of the embodiments of the present inventions. The usages or appearances of the phrase "in one embodiment" or "in another embodiment" (or the like) in the specification are not referring to the same embodiment, nor are separate or alternative embodiments necessarily mutually exclusive of one or more other embodiments, nor limited to a single exclusive embodiment. The same applies to the term "implementation." The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein.

Further, an embodiment or implementation described herein as "exemplary" is not to be construed as preferred or advantageous, for example, over other embodiments or implementations; rather, it is intended convey or indicate the embodiment or embodiments are example embodiment(s).

Although the present inventions have been described in certain specific aspects, many additional modifications and variations would be apparent to those skilled in the art. It is therefore to be understood that the present inventions may be practiced otherwise than specifically described without departing from the scope and spirit of the present inventions. Thus, embodiments of the present inventions should be considered in all respects as illustrative and not restrictive.

As used in the claims, the terms "comprises," "comprising," "includes," "including," "have," and "having" or any other variation thereof, are intended to cover a non-exclusive inclusion, such that a process, method, circuit, article, or apparatus that comprises a list of elements does not include only those elements but may include other elements not expressly listed or inherent to such process, method, article, or apparatus.

In the claims, and elsewhere, the terms "first," "second," and the like, herein do not denote any order, quantity, or importance, but rather are used to distinguish one element from another. Moreover, the terms "a" and "an" herein do not denote a limitation of quantity, but rather denote the presence of at least one of the referenced item. The term "data" may mean, among other things, a current or voltage signal(s) whether in analog or a digital form (which may be a single bit (or the like) or multiple bits (or the like)). Further, the term "logic tile" means a design unit or block of a plurality of transistors (typically thousands to millions), which, in this application, is capable of connecting or connected to a plurality of neighboring "tile", "core" or "block" (for example, in or during operation). Moreover, as noted above, the term (i) "integrated circuit" means, among other things, a processor, controller, state machine, gate array, SOC, PGA and/or FPGA, and (ii) "computing elements" means, among other things, a look-up-table, processor circuit, controller circuit and/or combinational logic circuit.

What is claimed is:

1. An integrated circuit comprising:
   a field programmable gate array including:
      a plurality of logic tiles, wherein each logic tile (i) is physically adjacent to at least one other logic tile of the plurality of logic tiles and (ii) includes:
         a configurable switch interconnect network, wherein the configurable switch interconnect network includes a plurality of switches electrically interconnected and arranged into a plurality of switch matrices, wherein the plurality of switch matrices are arranged into a plurality of stages including:
            at least two stages of switch matrices, configured in a hierarchical network, and a mesh stage of switch matrices, directly connected to the hierarchical network, wherein each switch matrix of the mesh stage includes an output that is directly connected to an input of a plurality of different switch matrices of the mesh stage, and wherein the mesh stage of switch matrices of each logic tile of the plurality of logic tile is directly connected to at least one mesh stage of switch matrices of at least one other logic tile of the plurality of the logic tiles.

2. The integrated circuit of claim 1 wherein the plurality of logic tiles are physically organized in one or more rows and/or one or more columns.

3. The integrated circuit of claim 1 wherein the mesh stage of switch matrices is a highest stage of the plurality of stages of switch matrices.

4. The integrated circuit of claim 1 wherein at least one of the logic tiles is configurable to communicate, during operation of the integrated circuit, with at least one other logic tile via the respective mesh stages.

5. The integrated circuit of claim 1 wherein each switch matrix of the mesh stage of each logic tile is directly connected to only one switch matrix of the switch matrices of the at least two of the stages of switch matrices of the associated configurable switch interconnect network of the logic tile.

6. The integrated circuit of claim 5 wherein the data stored in memory, during operation, controls which input of one or more switches of the plurality of switches is connected to an associated output.

7. The integrated circuit of claim 1 wherein each switch matrix of the mesh stage of switch matrices is electrically coupled between the switch matrices of the first and second stages of the associated configurable switch interconnect network of the logic tile.

8. The integrated circuit of claim 1 wherein:
the mesh stage of switch matrices of each logic tile is a highest stage of the plurality of stages of switch matrices,
at least one of the logic tiles is configurable to communicate, during operation of the integrated circuit, with at least one other logic tile via the respective mesh stages, and
each switch matrix of the mesh stage of each logic tile is directly connected to only one switch matrix of the switch matrices of the at least two of the stages of switch matrices of the associated configurable switch interconnect network of the logic tile.

9. An integrated circuit comprising:
a field programmable gate array including:
a plurality of logic tiles, electrically coupled to the control circuitry and the timing circuitry, wherein (i) the logic tiles are physically organized in at least one row and at least one column and (ii) each logic tile is electrically coupled and physically adjacent to at least one other logic tile of the plurality of logic tiles, and wherein each logic tile includes:
a configurable switch interconnect network which is electrically coupled to the computing elements, wherein the configurable switch interconnect network includes a plurality of switches electrically interconnected and organized into a plurality of stages of switch matrices including:
a first stage of switch matrices configured in a hierarchical network,
a second stage of switch matrices configured in a hierarchical network, and
a third stage of switch matrices, wherein each switch matrix of the third stage includes an output that is directly connected to an input of two or more different switch matrices of the third stage, and wherein the third stage of switch matrices is a highest stage of the plurality of stages of switch matrices; and
wherein the configurable switch interconnect network of each logic tile of the plurality of logic tile is directly connected to the configurable switch interconnect network of at least one other logic tile of the plurality of the logic tiles via the respective third stages of switch matrices.

10. The integrated circuit of claim 9 wherein an output of each switch matrix of the third stage of switch matrices is directly connected to at least one switch in at least three other switch matrices of the third stage of switch matrices of the associated configurable switch interconnect network of the logic tile.

11. The integrated circuit of claim 9 wherein:
each switch matrix of the first stage of switch matrices is configured in a radix-a network, where a is a whole number which is greater than or equal to 3, and
each switch matrix of the second stage of switch matrices is configured in a radix-b, where (i) b is equal to 2 or 3 and (ii) b is not equal to a.

12. The integrated circuit of claim 9 wherein at least one of the logic tiles is configurable to communicate, during operation of the integrated circuit, with at least one other logic tile via the respective third stages.

13. The integrated circuit of claim 9 wherein:
at least one of the logic tiles is configurable to communicate, during operation of the integrated circuit, with at least one other logic tile via the respective third stages, and
each switch matrix of the third stage of each logic tile is directly connected to only one switch matrix of the switch matrices of the first or second stages of switch matrices of the associated configurable switch interconnect network of the logic tile.

14. An integrated circuit comprising:
a field programmable gate array including:
a plurality of logic tiles physically organized in at least one row and at least one column and wherein each logic tile (i) is electrically coupled and physically adjacent to at least one other logic tile of the plurality of logic tiles and (ii) includes:
a configurable switch interconnect network which is electrically coupled to the memory, wherein the configurable switch interconnect network includes a plurality of switches electrically interconnected and organized into a plurality of switch matrices and wherein the plurality of switch matrices are arranged in a plurality of stages including:
a first stage of switch matrices configured in a hierarchical network,
a second stage of switch matrices configured in a hierarchical network, and
a third stage of switch matrices, wherein each switch matrix of the third stage includes an output that is directly connected to an input of two or more different switch matrices of the third stage; and
wherein the third stage of switch matrices of the configurable switch interconnect network of each logic tile of the plurality of logic tile is directly connected to the third stage of switch matrices of the configurable switch interconnect network of at least one other logic tile of the plurality of the logic tiles.

15. The integrated circuit of claim 14 wherein the third stage of switch matrices is a highest stage of the plurality of stages of switch matrices of the configurable switch interconnect network of each logic tile of the plurality of logic tile.

16. The integrated circuit of claim 14 wherein:
the plurality of stages of switch matrices includes:
a first stage of switch matrices which is configured in a radix-a network, where a is a whole number which is greater than or equal to 3,
a second stage of switch matrices is configured in a radix-b network, where b is a whole number which is greater than or equal to 3, and
wherein (1) the second stage of switch matrices is located between the first stage of switch matrices and the third stage of switch matrices, and (2) the third stage of switch matrices is a highest stage of the plurality of stages of switch matrices.

17. The integrated circuit of claim 14 wherein each switch matrix of the third stage is directly connected to only one switch matrix of the switch matrices of the first or second stages of switch matrices of the associated configurable switch interconnect network of the logic tile.

18. The integrated circuit of claim 14 wherein the plurality of switch matrices of the configurable switch interconnect network of each logic tile of the plurality of logic tiles further include a fourth stage of switch matrices wherein each switch matrix of the fourth stage includes an output that is directly connected to an input of two or more different switch matrices of the fourth stage of the associated configurable switch interconnect network of the logic tile.

19. The integrated circuit of claim 18 wherein each switch matrix of the fourth stage of switch matrices is electrically coupled between the switch matrices of the first and second stages of the associated configurable switch interconnect network of the logic tile.

20. The integrated circuit of claim 19 wherein the third stage of switch matrices is a highest stage of the plurality of stages of switch matrices of the configurable switch interconnect network of each logic tile of the plurality of logic tiles.

* * * * *